US012811581B2

(12) United States Patent
Yuguchi et al.

(10) Patent No.: US 12,811,581 B2
(45) Date of Patent: Nov. 24, 2026

(54) SEMICONDUCTOR CIRCUIT

(71) Applicant: SHINDENGEN ELECTRIC MANUFACTURING CO., LTD., Tokyo (JP)

(72) Inventors: Junya Yuguchi, Saitama (JP); Yuji Morinaga, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 19/074,439

(22) Filed: Mar. 10, 2025

(65) Prior Publication Data

US 2025/0300653 A1 Sep. 25, 2025

(30) Foreign Application Priority Data

Mar. 11, 2024 (JP) ................................. 2024-036474

(51) Int. Cl.
*H03K 17/16* (2006.01)

(52) U.S. Cl.
CPC ... *H03K 17/162* (2013.01); *H03K 2217/0027* (2013.01); *H03K 2217/0063* (2013.01); *H03K 2217/0072* (2013.01)

(58) Field of Classification Search
CPC ............... H03K 17/161; H03K 17/162; H03K 2217/0027; H03K 2217/0063; H03K 2217/0072
USPC .................................................. 327/427, 434
See application file for complete search history.

(56) References Cited

U.S. PATENT DOCUMENTS

| | | | | |
|---|---|---|---|---|
| 7,508,182 B1 * | 3/2009 | Chang ................. | H02M 3/1588 323/282 |
| 9,213,055 B2 | 12/2015 | Yataka et al. | |
| 2007/0159751 A1 | 7/2007 | Hussein et al. | |
| 2014/0339995 A1 * | 11/2014 | Zanbaghi ........... | H05B 45/3725 315/307 |
| 2017/0012533 A1 | 1/2017 | Ribarich | |
| 2019/0372567 A1 | 12/2019 | Yoshida et al. | |
| 2022/0294330 A1 * | 9/2022 | Huang ................ | H02M 1/0009 |
| 2025/0226744 A1 * | 7/2025 | Feng ................... | H02M 1/0009 |

FOREIGN PATENT DOCUMENTS

JP 2022-115706 A 8/2022

OTHER PUBLICATIONS

Extended European Search Report in EP Application No. 25160526.7, dated Jul. 14, 2025, 10pp.

* cited by examiner

*Primary Examiner* — William Hernandez
(74) *Attorney, Agent, or Firm* — HAUPTMAN HAM, LLP

(57) ABSTRACT

A semiconductor circuit includes: a switching circuit having at least one switching element Q; a ground wiring; and a current detection circuit connected between the switching circuit and the ground wiring. A noise eliminating circuit is connected between the switching circuit and the ground wiring in a parallel relationship with respect to the current detection circuit.

10 Claims, 23 Drawing Sheets

SIMULATION MODEL

TEST EXAMPLE 1
(EMBODIMENT EXAMPLE)

TEST EXAMPLE 2
(COMPARISON EXAMPLE)

SEMICONDUCTOR CIRCUIT

CROSS REFERENCE TO RELATED APPLICATIONS

This application claims priority to Japanese Patent Application No. 2024-36474, filed on Mar. 11, 2024, which is expressly incorporated herein by reference in its entirety.

TECHNICAL FIELD

The present invention relates to a semiconductor circuit.

BACKGROUND ART

There has been known a semiconductor circuit that uses a wide bandgap semiconductor (see patent literature 1, for example). The wide bandgap semiconductor is a device capable of acquiring a high withstand voltage, a large power and a high frequency and hence, a semiconductor circuit that uses the wide bandgap semiconductor becomes a circuit having a high withstand voltage, a large power and a high frequency, and can be used in various application fields.

PRIOR ART LITERATURE

[Patent Literature] JP-A-2022-115706

SUMMARY OF INVENTION

Technical Problem

However, a semiconductor circuit that uses a wide bandgap semiconductor is liable to generate a loss or ringing because of a parasitic inductance since switching is performed at a high speed. Ringing is generated not only in a drain (collector) of the switching element but also in a source (emitter) of the switching element. Ringing generated in the source (emitter) is also generated in a gate via a capacitance of the switching element thus generating erroneous turning-on of the switching element whereby there arises a drawback that the switching element breaks down. The ringing of the gate is particularly liable to occur in a circuit where impedance between the switching element and a ground wiring becomes large (for example, a circuit where the current detection is performed by connecting a current detection-use element to the source (emitter)). Accordingly, there has been a demand for the reduction of ringing that occurs in the switching element.

In view of the above-mentioned circumstances, it is an object of the present invention to provide a semiconductor circuit that can suppress ringing that occurs in a gate of a switching element.

Solution to Problem

[1] A semiconductor circuit according to the present invention is a semiconductor circuit that includes: a switching circuit having at least one switching element; a ground wiring; and a current detection circuit connected between the switching circuit and the ground wiring, wherein a noise eliminating circuit is connected between the switching circuit and the ground wiring in a parallel relationship with respect to the current detection circuit.

[2] In the semiconductor circuit of the present invention, it is desired that the noise eliminating circuit is an RC series circuit where a resistor and a capacitor are connected in series.

[3] In the semiconductor circuit according to the present invention, it is desired that the switching circuit is a circuit that includes a half bridge circuit having a high-side switching element and a low-side switching element, and the noise eliminating circuit is connected between the low-side switching element and the ground wiring.

[4] In the semiconductor circuit according to the present invention, it is desired that the switching circuit is a full bridge circuit where two half bridge circuits are connected in parallel to each other.

[5] In the semiconductor circuit according to the present invention, it is desired that both of the high-side switching element and the low-side switching element are each formed of a transistor.

[6] In the semiconductor circuit according to the present invention, it is desired that the high-side switching element is formed of a diode, and the low-side switching element is formed of a transistor.

[7] In the semiconductor circuit according to the present invention, it is desired that the switching circuit is a circuit where three or more half bridge circuits are connected in parallel to each other.

[8] In the semiconductor circuit according to the present invention, it is desired that the switching circuit is accommodated in a package, and both of the current detection circuit and the noise eliminating circuit are disposed outside the package.

[9] In the semiconductor circuit according to the present invention, it is desired that the semiconductor circuit has a structure where the switching circuit and either one of the resistor and the capacitor that constitute the RC series circuit are accommodated inside the package, and the current detection circuit and the other out of the resistor and the capacitor that constitute the RC series circuit are disposed outside the package.

[10] In the semiconductor circuit according to the present invention, it is desired that the semiconductor circuit has a structure where both the switching circuit and the noise eliminating circuit are accommodated in the package, and the current detection circuit is disposed outside the package.

[11] In the semiconductor circuit according to the present invention, it is desired that the semiconductor circuit has a structure where all of the switching circuit, the noise eliminating circuit and the current detection circuit are accommodated in one package.

Advantageous Effects of the Present Invention

According to the semiconductor circuit of the present invention, the noise eliminating circuit is connected between the switching circuit and the ground wiring in a parallel relationship with respect to the current detection circuit. With such a configuration, it is possible to suppress ringing that occurs in the switching circuit (for example, between a source (an emitter) of the switching circuit and the ground wiring) and hence, it is possible to suppress ringing that occurs in the gate of the switching element.

DESCRIPTION OF EMBODIMENTS

Figure 1:
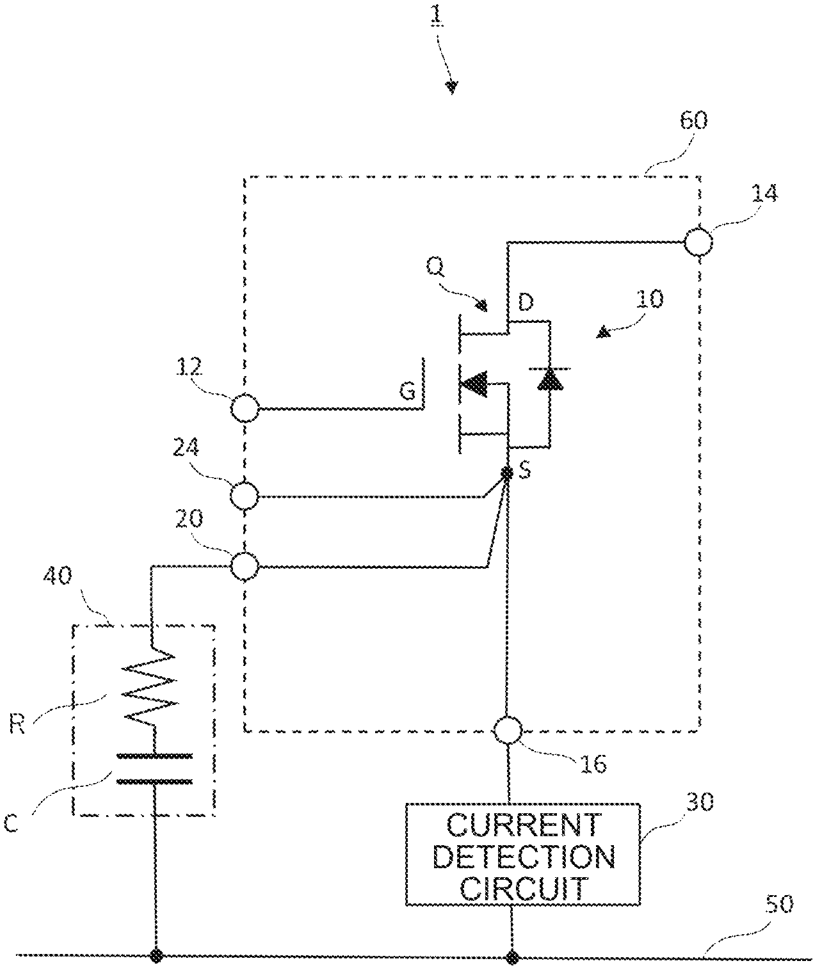
FIG. 1 is a view illustrating a semiconductor circuit 1 according to an embodiment 1.

Hereinafter, a semiconductor circuit according to the present invention is described based on respective embodiments illustrated in the drawings. In the respective embodiments described hereinafter, with respect to constitutional elements that have substantially the same functions, even when the constitutional elements differ from each other more or less in shape or the like, there may be a case that the same symbols are used over the embodiments, and the repeated explanation is omitted. The embodiments described hereinafter are not intended to limit the present invention called for in claims. Further, it is not always the case that all of various elements described in the embodiments and combinations of these elements are indispensable as a means to solve the problems of the present invention.

Embodiment 1

FIG. 1 is a view illustrating a semiconductor circuit 1 according to an embodiment 1. The semiconductor circuit 1 according to the embodiment 1 is a semiconductor circuit that includes: a switching circuit 10 having a transistor Q that functions as a switching element; a ground wiring 50; and a current detection circuit 30 that is connected between the switching circuit 10 and the ground wiring 50. A noise eliminating circuit 40 is connected between the switching circuit 10 and the ground wiring 50 in a parallel relationship with respect to the current detection circuit 30.

In the semiconductor circuit 1 according to the embodiment 1, the switching circuit 10 uses a transistor Q formed of a MOSFET that functions as a switching element. As a transistor Q, a transistor formed of a wide bandgap semiconductor (for example, SiC, GaN, diamond or the like) is used.

In the semiconductor circuit 1 according to the embodiment 1, as the noise eliminating circuit 40, an RC series circuit formed by connecting a resistor R and a capacitor C in series is used.

In the semiconductor circuit 1 according to the embodiment 1, symbol 12 indicates a gate terminal, symbol 14 indicates a power terminal, symbol 16 indicates a ground terminal, symbol 20 indicates a noise eliminating circuit terminal 20, and symbol 24 indicates a source sense terminal. The noise eliminating circuit terminal 20 and the source sense terminal 24 may be used in common thus forming one terminal. Symbol 60 indicates a package formed by molding using a mold resin.

In the semiconductor circuit 1 according to the embodiment 1, the current detection circuit 30 is connected between the ground terminal 30 and the ground wiring 50 in a region outside the package 60. The noise eliminating circuit 40 is connected between the noise eliminating circuit terminal 20 and the ground wiring 50 also in a region outside the package 60.

Advantageous Effects of Embodiment 1

According to the semiconductor circuit 1 of the embodiment 1, the noise eliminating circuit 40 is connected between the switching circuit 10 and the ground wiring 50 in a parallel relationship with respect to the current detection circuit 30. Accordingly, it is possible to suppress ringing that occurs in the switching circuit 10 (in this case, between the source S of the transistor Q and the ground wiring 50) and hence, it is possible to suppress ringing that occurs in the gate G of the switching element.

According to the semiconductor circuit 1 of the embodiment 1, the noise eliminating circuit 40 is the RC series circuit where the resistor R and the capacitor C are connected in series. Accordingly, with the relatively simple configuration, it is possible to suppress ringing that occurs between the switching circuit 10 and the ground wiring 50 and hence, it is possible to suppress ringing that occurs in the gate G of the switching element.

According to the semiconductor circuit 1 of the embodiment 1, the structure is adopted where the current detection circuit 30 and the noise eliminating circuit 40 are disposed outside the package 60. Accordingly, a characteristic of the noise eliminating circuit 40 can be easily optimized and hence, it is possible to further effectively suppress ringing that occurs in the switching element.

[Modifications 1 to 3 of Embodiment 1]

Figure 2:
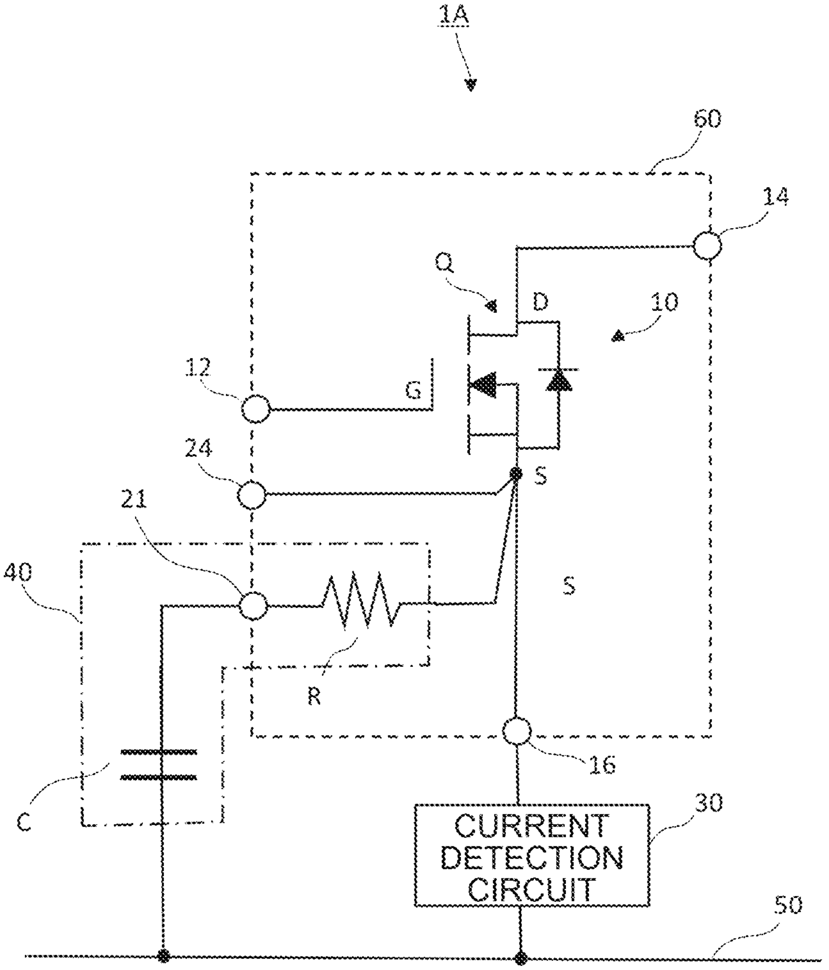
FIG. 2 is a view illustrating a semiconductor circuit 1A according to a modification 1 of the embodiment 1.
Figure 3:
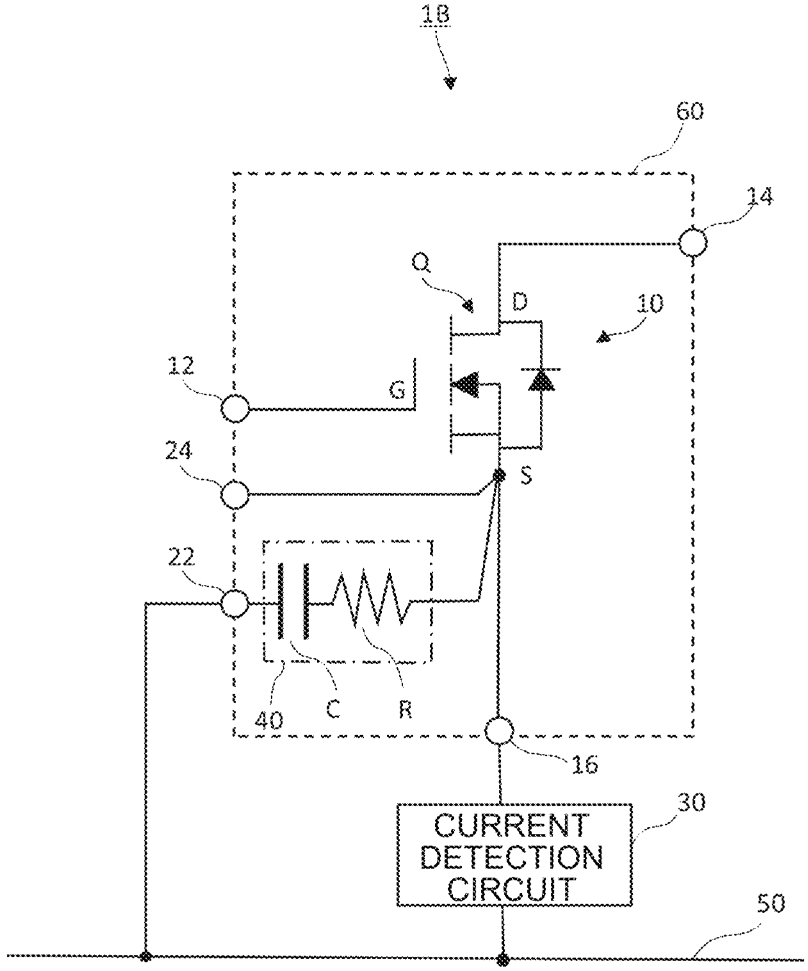
FIG. 3 is a view illustrating a semiconductor circuit 1B according to a modification 2 of the embodiment 1
Figure 4:
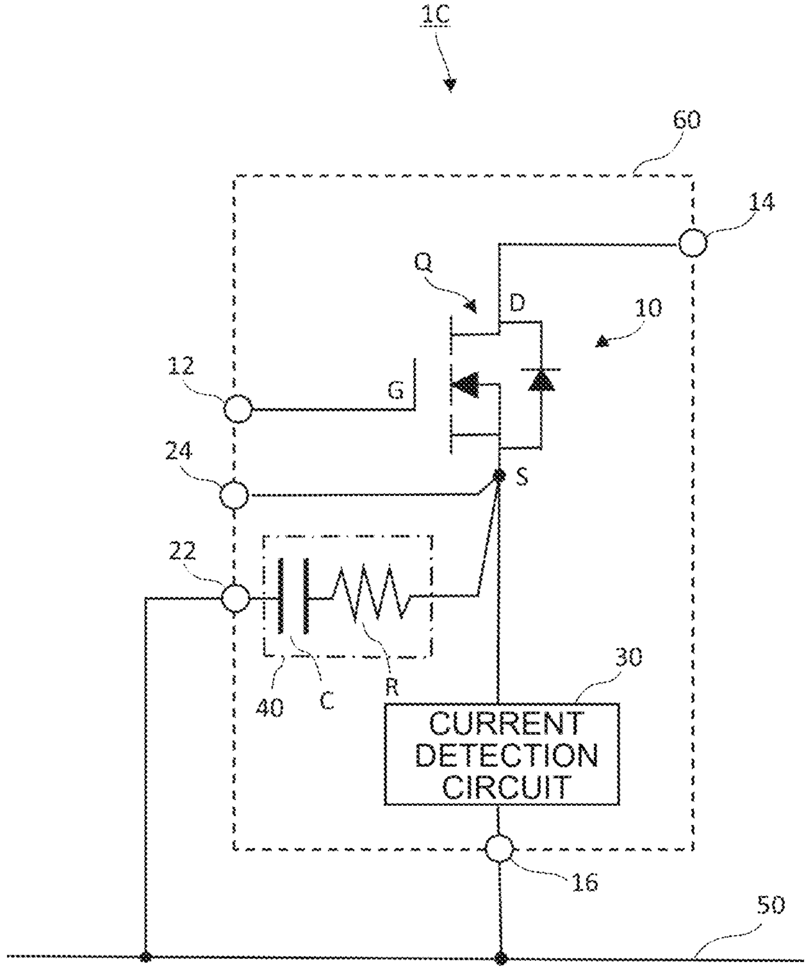
FIG. 4 is a view illustrating a semiconductor circuit 1C according to a modification 3 of the embodiment 1

FIG. 2 is a view illustrating a semiconductor circuit 1A according to a modification 1 of the embodiment 1. FIG. 3 is a view illustrating a semiconductor circuit 1B according to a modification 2 of the embodiment 1. FIG. 4 is a view illustrating a semiconductor circuit 1C according to a modification 3 of the embodiment 1.

[Modification 1 of Embodiment 1]

As illustrated in FIG. 2, the semiconductor circuit 1A according to the modification 1 of the embodiment 1 has the structure where a switching circuit 10 and either one of a resistor R and a capacitor C that constitute an RC series circuit of a noise eliminating circuit 40 (in this case, the resistor R) are accommodated in a package 60, and a current detection circuit 30 and the other out of the resistor R and the capacitor C that constitute the RC series circuit of the noise eliminating circuit 40 (in this case, the capacitor C) are disposed outside the package 60. In the semiconductor circuit 1A according to the modification 1 of the embodiment 1, symbol 21 indicates a terminal positioned between the resistor R and the capacitor C of the noise eliminating circuit 40.

According to the semiconductor circuit 1A of the modification 1 of the embodiment 1, as described above, by accommodating either one of the resistor R and the capacitor C that constitute the RC series circuit of the noise eliminating circuit 40 in the package 60, the number of parts mounted outside the package 60 can be reduced and hence, wiring of the noise eliminating circuit 40 is shortened so that impedance is lowered whereby it is possible to more effectively suppress ringing that occurs in the gate G of the switching element.

[Modification 2 of Embodiment 1]

As illustrated in FIG. 3, the semiconductor circuit 1B according to the modification 2 of the embodiment 1 has the structure where both of a switching circuit 10 and a noise eliminating circuit 40 are accommodated in a package 60, and a current detection circuit 30 is disposed outside the package 60. In the semiconductor circuit 1B according to the modification 2 of the embodiment 1, symbol 22 indicates a terminal that is positioned between the noise eliminating circuit 40 and a ground wiring 50.

According to the semiconductor circuit 1B of the modification 2 of the embodiment 1, as described above, by accommodating the noise eliminating circuit 40 in the package 60, among parts that constitute the noise eliminating circuit 40, no part is mounted outside the package 60 and hence, wiring of the noise eliminating circuit 40 is further shortened so that impedance is lowered whereby it is possible to acquire an advantageous effect that ringing that occurs in a gate G of a switching element can be more effectively suppressed.

[Modification 3 of embodiment 1]

As illustrated in FIG. 4, a semiconductor circuit 1C according to the modification 3 of the embodiment 1 has the structure where all of a switching circuit 10, a noise eliminating circuit 40 and a current detection circuit 30 are accommodated in one package 60. In the semiconductor circuit 1C of the modification 3 according to the embodiment 1, symbol 22 indicates a terminal positioned between the noise eliminating circuit 40 and the ground wiring 50.

According to the semiconductor circuit 1C of the modification 3 of the embodiment 1, a mounting area can be reduced and hence, it is also possible to acquire an advantageous effect that a more compact semiconductor circuit can be provided.

Embodiment 2

Figure 5:
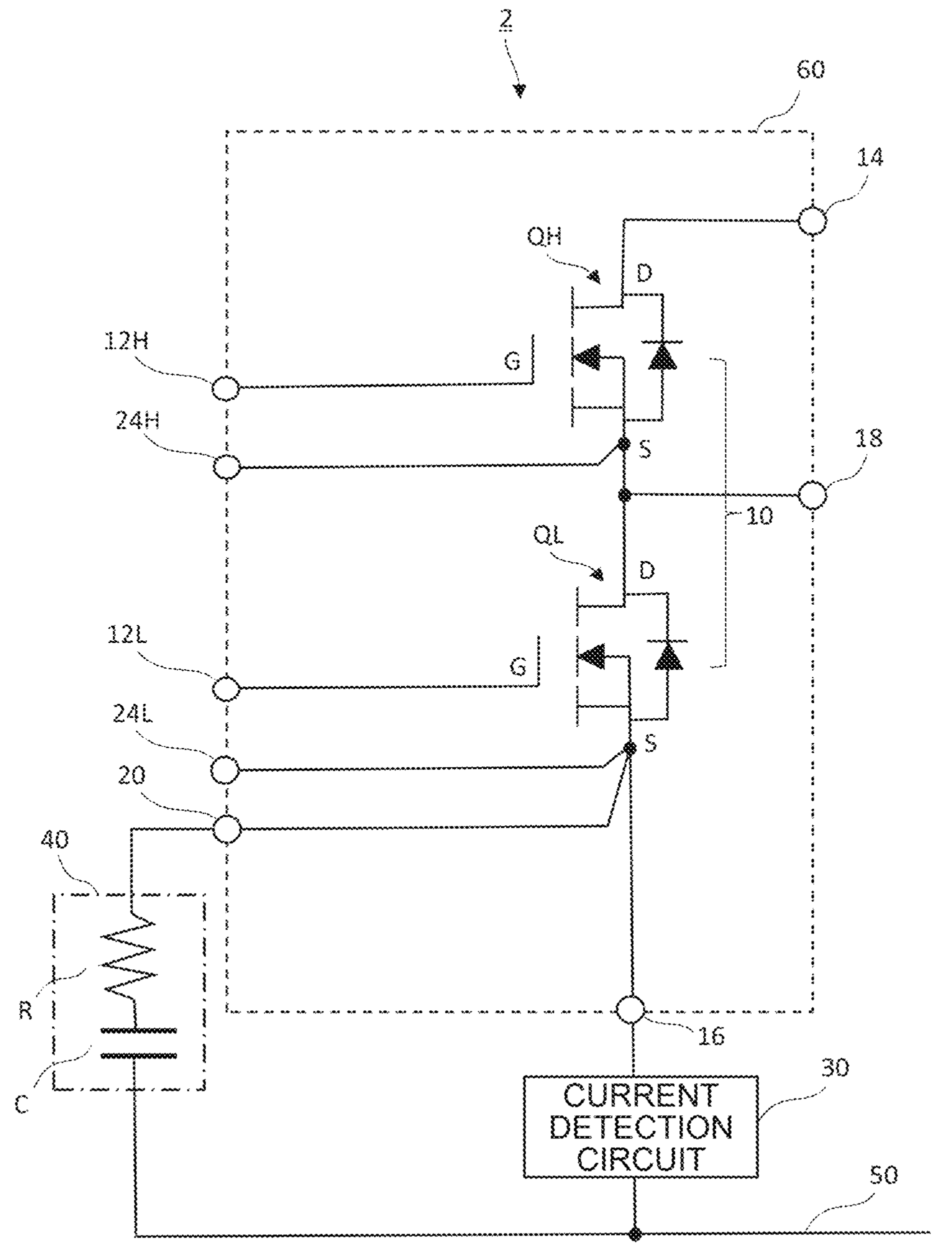
FIG. 5 is a view illustrating a semiconductor circuit 2 according to an embodiment 2.

FIG. 5 is a view illustrating a semiconductor circuit 2 according to an embodiment 2. The semiconductor circuit 2 according to the embodiment 2 basically has the substantially same configuration as the semiconductor circuit 1 according to the embodiment 1. However, the configuration of a switching circuit 10 differs from the configuration of the semiconductor circuit 1 according to the embodiment 1. That is, as illustrated in FIG. 5, the semiconductor circuit 2 according to the embodiment 2 uses, as the switching circuit 10, a switching circuit formed of a half bridge circuit having a high-side switching element (transistor QH) and a low-side switching element (transistor QL). A noise eliminating circuit 40 is connected between the low-side switching element (transistor QL) and a ground wiring 50.

In the semiconductor circuit 2 according to the embodiment 2, symbols 12H, 12L indicate gate terminals, symbol 18 indicates a middle point terminal, and symbol 24H, 24L indicate source sense terminals. The noise eliminating circuit terminal 20 and the source sense terminal 24 on a low side may be shared in common thus forming one terminal. In this specification, symbol H indicates a high side and symbol L indicates a low side.

According to the semiconductor circuit 2 of the embodiment 2, the configuration of the switching circuit 10 differs from the configuration of the corresponding switching circuit 10 in the semiconductor circuit 1 according to the embodiment 1. However, in the same manner as the case of the semiconductor circuit 1 according to the embodiment 1, the noise eliminating circuit 40 is connected between the switching circuit 10 and the ground wiring 50 in a parallel relationship with respect to a current detection circuit 30. Accordingly, in the same manner as the advantageous effects of the semiconductor circuit 1 according to the embodiment 1, it is possible to suppress ringing that occurs in the switching circuit 10 (in this case, between a source S of the transistor QL and the ground wiring 50) and hence, it is possible to suppress ringing that occurs in a gate G of the switching element.

Further, according to the semiconductor circuit 2 of the embodiment 2, the noise eliminating circuit 40 is an RC series circuit where a resistor R and a capacitor C are connected in series and hence, in the same manner as the advantageous effects acquired by the semiconductor circuit 1 according to the embodiment 1, it is possible to suppress ringing that occurs between the switching circuit 10 and the ground wiring 50 with the relatively simple configuration whereby ringing that occurs in the gate G of the switching element can be suppressed.

Further, the semiconductor circuit 2 according to the embodiment 2 has the structure where the current detection circuit 30 and the noise eliminating circuit 40 are disposed outside the package 60. Accordingly, in the same manner as the advantageous effects acquired by the semiconductor circuit 1 of the embodiment 1, a characteristic of the noise eliminating circuit 40 can be easily optimized and hence, it is possible to more effectively suppress ringing that occurs in the switching element.

[Modifications 1 to 3 of the Embodiment 2]

Figure 6:
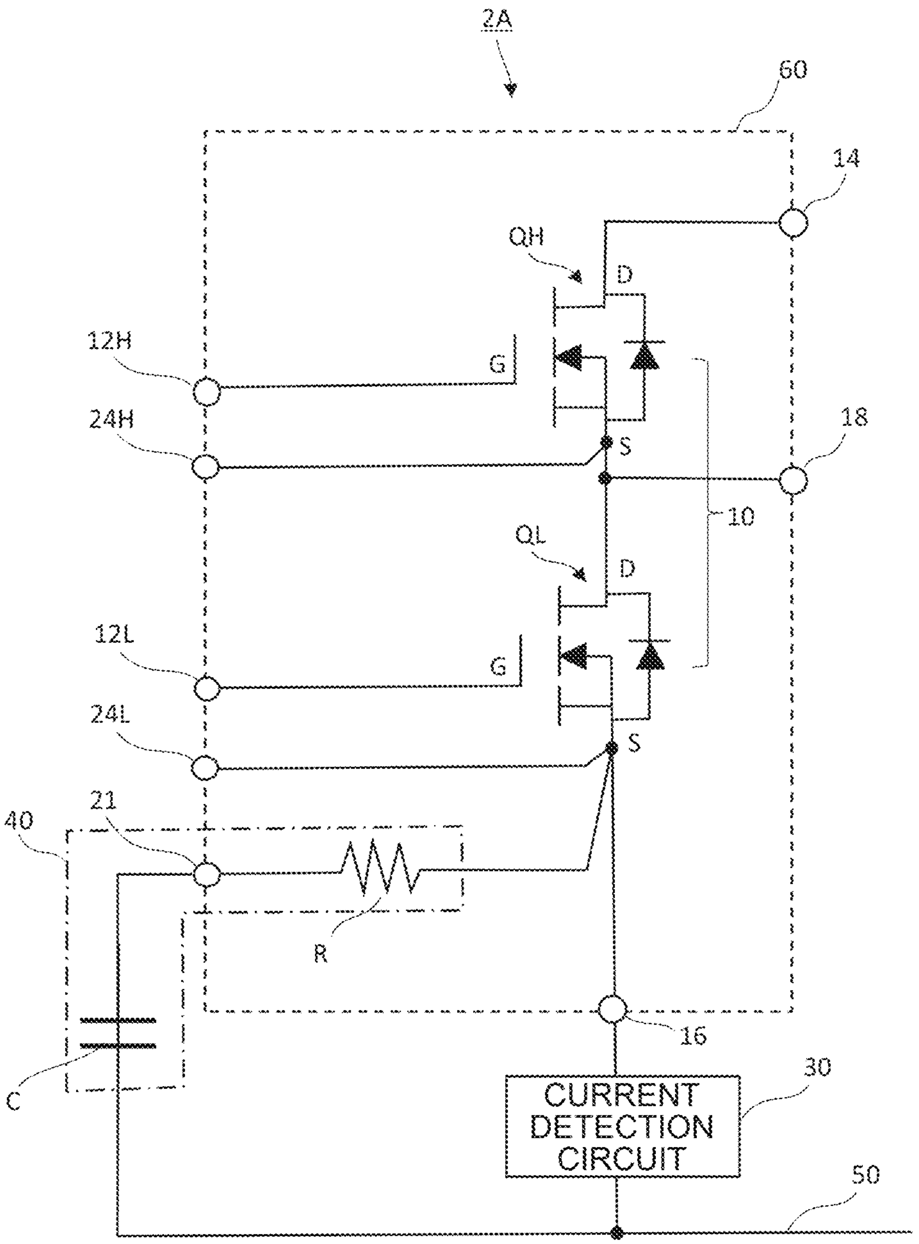
FIG. 6 is a view illustrating a semiconductor circuit 2A according to a modification 2 of the embodiment 2.
Figure 7:
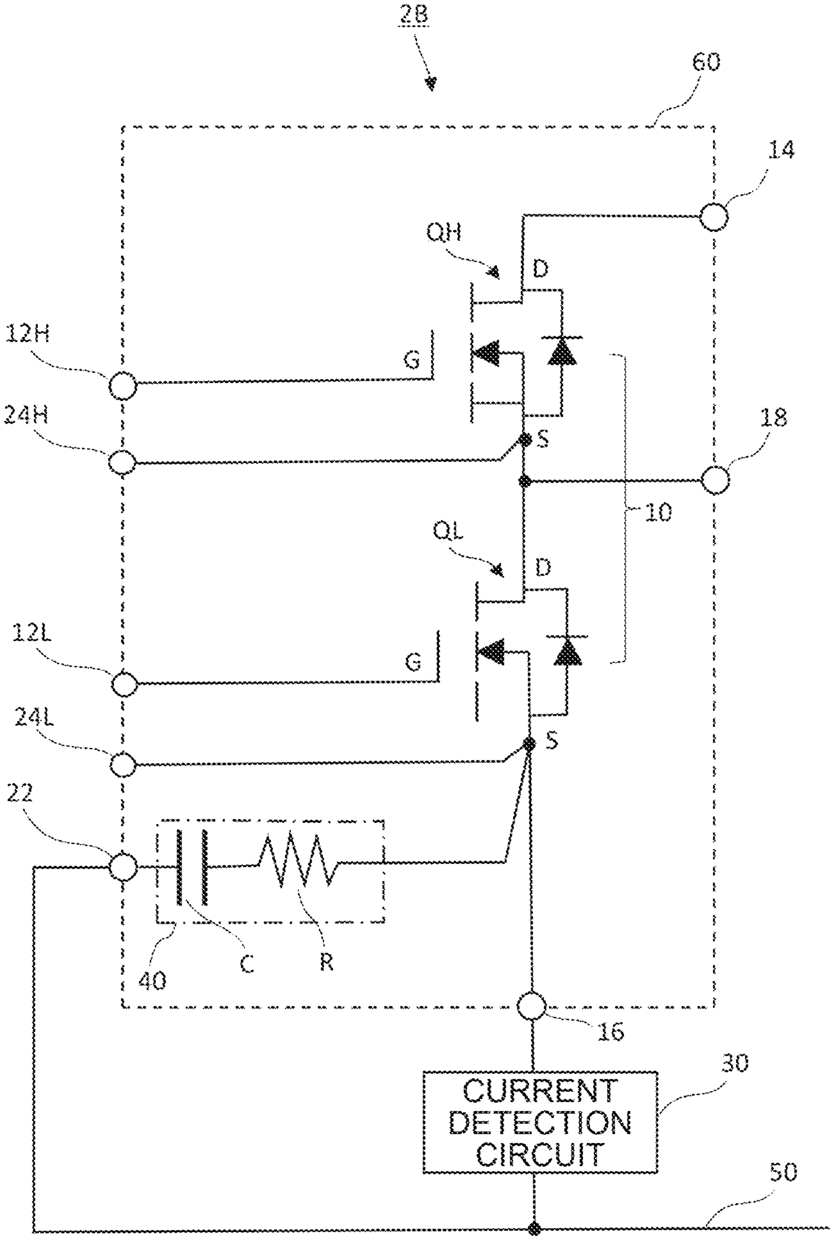
FIG. 7 is a view illustrating a semiconductor circuit 2B according to a modification 2 of the embodiment 2.
Figure 8:
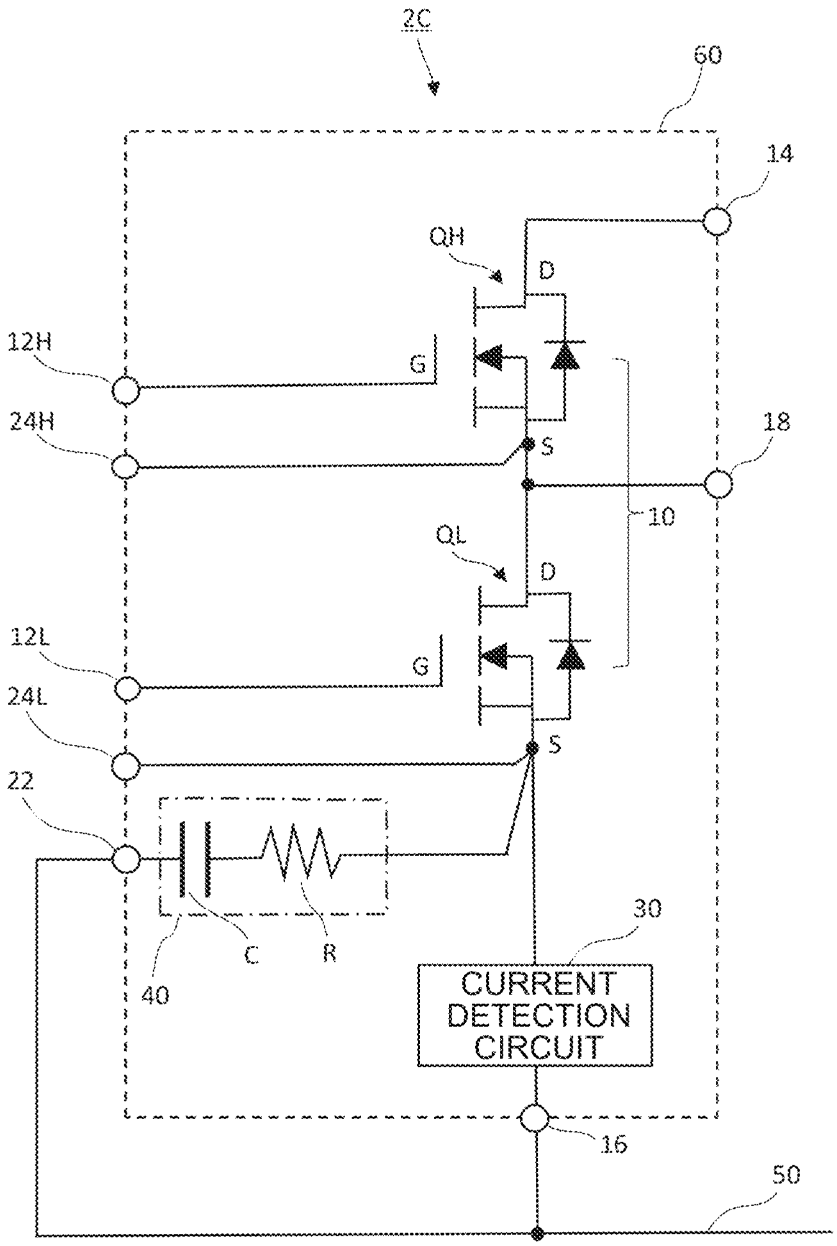
FIG. 8 is a view illustrating a semiconductor circuit 2C according to a modification 3 of the embodiment 2.

FIG. 6 is a view illustrating a semiconductor circuit 2A according to a modification 1 of the embodiment 2. FIG. 7 is a view illustrating a semiconductor circuit 2B according to a modification 2 of the embodiment 2. FIG. 8 is a view illustrating a semiconductor circuit 20 according to a modification 3 of the embodiment 2.

[Modification 1 of Embodiment 2]

The semiconductor circuit 2A according to the modification 1 of the embodiment 2 has basically substantially the same configuration as the semiconductor circuit 2 according to the embodiment 2. However, the semiconductor circuit 2A according to the modification 1 of the embodiment 2 differs from the semiconductor circuit 2 according to the embodiment 2 with respect to the arrangement position of a noise eliminating circuit 40. That is, as illustrated in FIG. 6, the semiconductor circuit 2A according to the modification 1 of the embodiment 2 has the structure where a switching circuit 10 and either one of a resistor R and a capacitor C that constitute an RC series circuit of the noise eliminating circuit 40 (the resistor R in this case) are accommodated in a package 60, and a current detection circuit 30 and the other out of the resistor R and the capacitor C that constitute the RC series circuit of the noise eliminating circuit 40 (the capacitor C in this case) are disposed outside the package 60. With respect to the semiconductor circuit 2A according to the modification 1 of the embodiment 2, symbol 21 indicates a terminal positioned between the resistor R and the capacitor C of the noise eliminating circuit 40.

According to the semiconductor circuit 2A of the modification 1 of the embodiment 2, as described above, either one of the resistor R and the capacitor C that constitute the RC series circuit of the noise eliminating circuit 40 is accommodated in the package 60. Accordingly, the number of parts mounted outside the package 60 can be reduced and hence, wiring of the noise eliminating circuit 40 is shortened so that impedance is lowered whereby it is possible to more effectively suppress ringing that occurs in a gate G of a switching element.

[Modification 2 According to Embodiment 2]

As illustrated in FIG. 7, a semiconductor circuit 2B according to a modification 2 of the embodiment 2 has the structure where both of a switching circuit 10 and a noise eliminating circuit 40 are accommodated in a package 60, and a current detection circuit 30 is disposed outside the package 60. In the semiconductor circuit 2B according to the modification 2 of the embodiment 2, symbol 22 indicates a terminal that is positioned between a capacitor C of the noise eliminating circuit 40 and a ground wiring 50.

As described above, according to the semiconductor circuit 2B of the modification 2 of the embodiment 2, the noise eliminating circuit 40 is accommodated in the package 60. Accordingly, among parts that constitute the noise eliminating circuit 40, no part is externally mounted outside the package 60 and hence, wiring of the noise eliminating circuit 40 is further shortened so that impedance is lowered whereby it is possible to acquire an advantageous effect that ringing that occurs in a gate G of a switching element can be more effectively suppressed.

[Modification 3 of Embodiment 2]

As illustrated in FIG. 8, the semiconductor circuit 2C according to the modification 3 of the embodiment 2 has the structure where all of a switching circuit 10, a noise eliminating circuit 40 and a current detection circuit 30 are accommodated in one package 60. In the semiconductor circuit 2C according to the modification 3 of the embodiment 2, symbol 22 indicates a terminal that is positioned between a capacitor C of the noise eliminating circuit 40 and a ground wiring 50.

According to the semiconductor circuit 2C of the modification 3 of the embodiment 2, it is also possible to acquire an advantageous effect that a mounting area can be reduced and hence, it is possible to provide a more compact semiconductor circuit.

Embodiment 3

Figure 9:
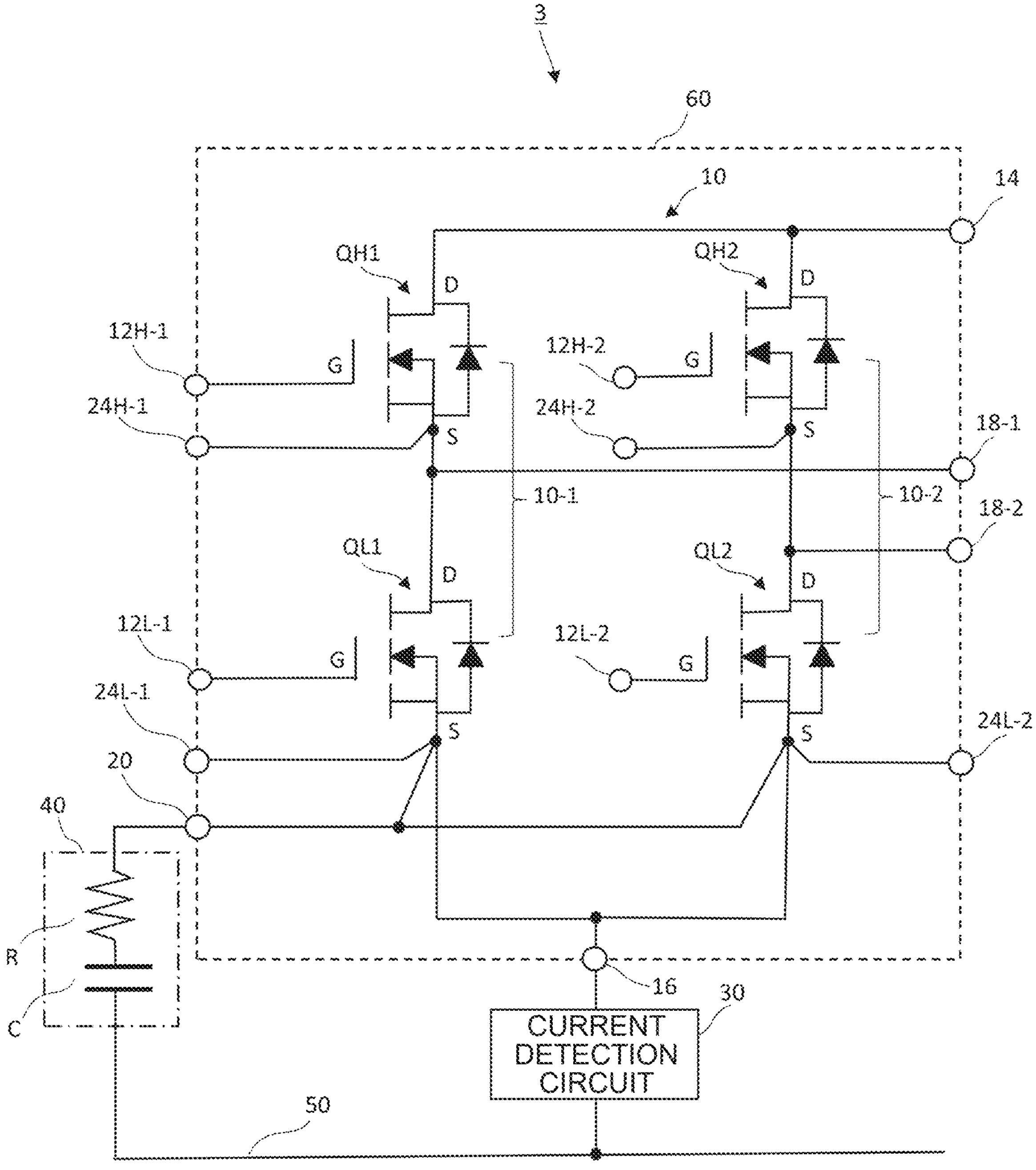
FIG. 9 is a view illustrating a semiconductor circuit 3 according to an embodiment 3.

FIG. 9 is a view illustrating a semiconductor circuit 3 according to an embodiment 3. The semiconductor circuit 3 according to the embodiment 3 has basically substantially the same configuration as the semiconductor circuit 2 according to the embodiment 2. However, the configuration of a switching element 10 in the semiconductor circuit 3 according to the embodiment 3 differs from the configuration of the switching element 10 in the semiconductor circuit 2 according to the embodiment 2. That is, as illustrated in FIG. 9, the semiconductor circuit 3 according to the embodiment 3 uses, as the switching circuit 10, a switching circuit is a full bridge circuit where two half bridge circuits 10-1, 10-2 are connected in parallel to each other. Further, a noise eliminating circuit 40 is connected between a low-side switching elements (transistors QL1, QL2) and a ground wiring 50.

In the semiconductor circuit 3 according to the embodiment 3, symbols 12H-1, 12H-2, 12L-1, 12L-2 indicate gate terminals, symbols 18-1, 18-2 indicate middle point terminals, symbols 24H-1, 24H-2, 24L-1, 24L-2 indicate source sense terminals, and symbols QH1, QH2, QL1, QL2 indicate transistors (MOSFETs). A noise eliminating circuit terminal 20 and a low-side the source sense terminal 24L-1 may be shared in common thus forming one terminal, and the noise eliminating circuit terminal 20 and the low-side source sense terminal 24L-2 may be shared in common thus forming one terminal.

The semiconductor circuit 3 according to the embodiment 3 differs from the semiconductor circuit 2 according to the embodiment 2 with respect to the configuration of the switching circuit 10. However, the configuration of the semiconductor circuit 3 according to the embodiment 3 is substantially equal to the configuration of the semiconductor circuit 2 according the embodiment 2 except for the configuration of the switching circuit 10. Accordingly, in the same manner as the semiconductor circuit 2 of the embodiment 2, a noise eliminating circuit 40 is connected between the switching circuit 10 and the ground wiring 50 in a parallel relationship with respect to a current detection circuit 30. Accordingly, in the same manner as the advantageous effects of the semiconductor circuit 2 according to the embodiment 2, it is possible to suppress ringing that occurs in the switching circuit 10 (in this case, between sources S of the transistors QL1, QL2 and the ground wiring 50) and hence, it is possible to suppress ringing that occurs in gates G of switching elements.

Further, according to the semiconductor circuit 3 of the embodiment 3, the noise eliminating circuit 40 is an RC series circuit formed by connecting a resistor R and a capacitor C in series. Accordingly, in the same manner as the advantageous effects of the semiconductor circuit 1 according to the embodiment 1, with the relatively simple configuration, it is possible to suppress ringing that occurs between the switching circuit 10 and the ground wiring 50 and hence, it is possible to suppress ringing that occurs in the gates G of the switching elements.

The semiconductor circuit 3 according to the embodiment 3 has the structure where the current detection circuit 30 and the noise eliminating circuit 40 are disposed outside the package 60. Accordingly, in the same manner as the advantageous effects of the semiconductor circuit 1 according to the embodiment 1, characteristic of the noise eliminating circuit 40 can be easily optimized and hence, it is possible to more effectively suppress ringing that occurs in the switching element.

[Modifications 1 to 6 of Embodiment 3]

Figure 10:
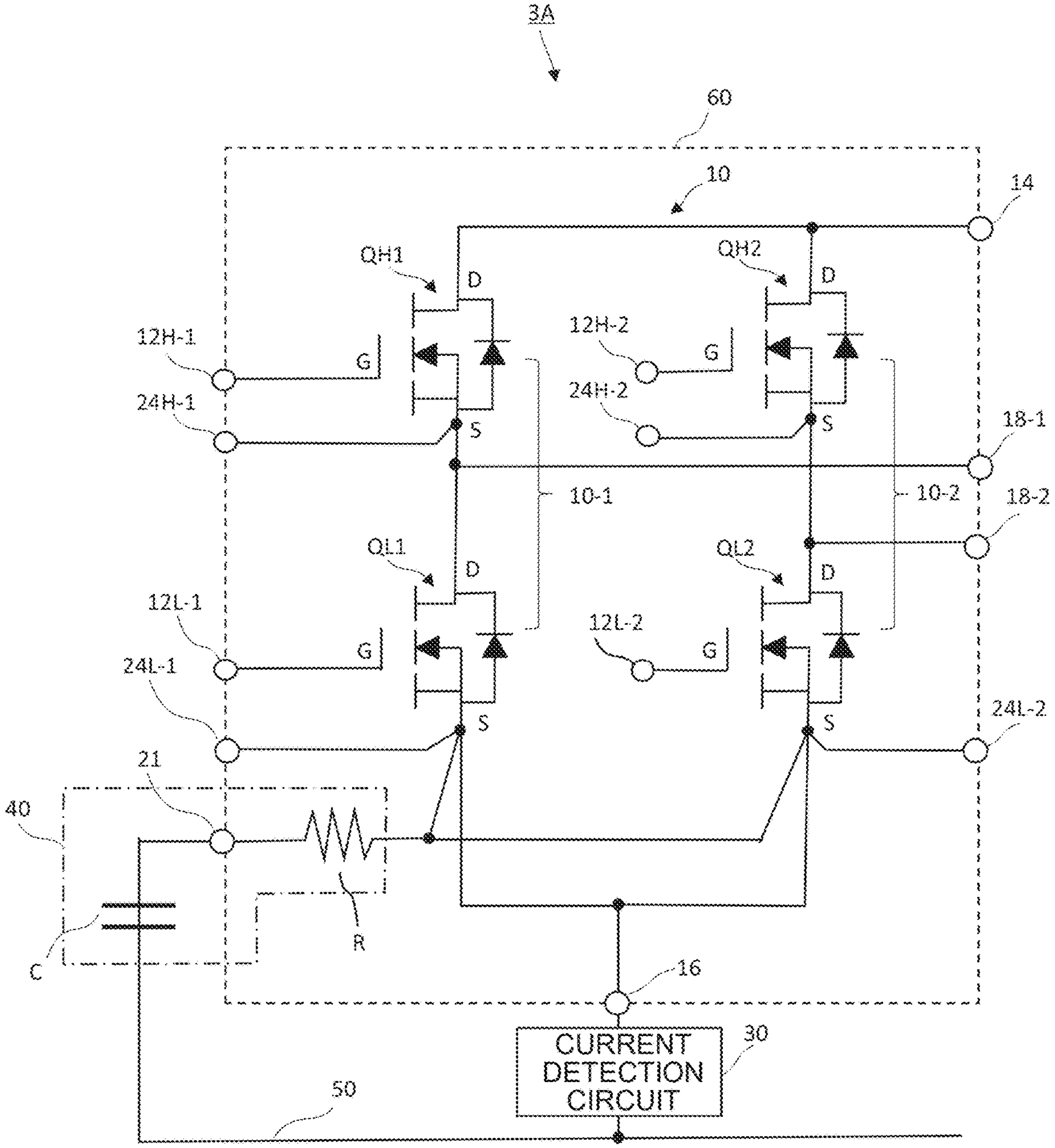
FIG. 10 is a view illustrating a semiconductor circuit 3A according to a modification 1 of the embodiment 3.
Figure 11:
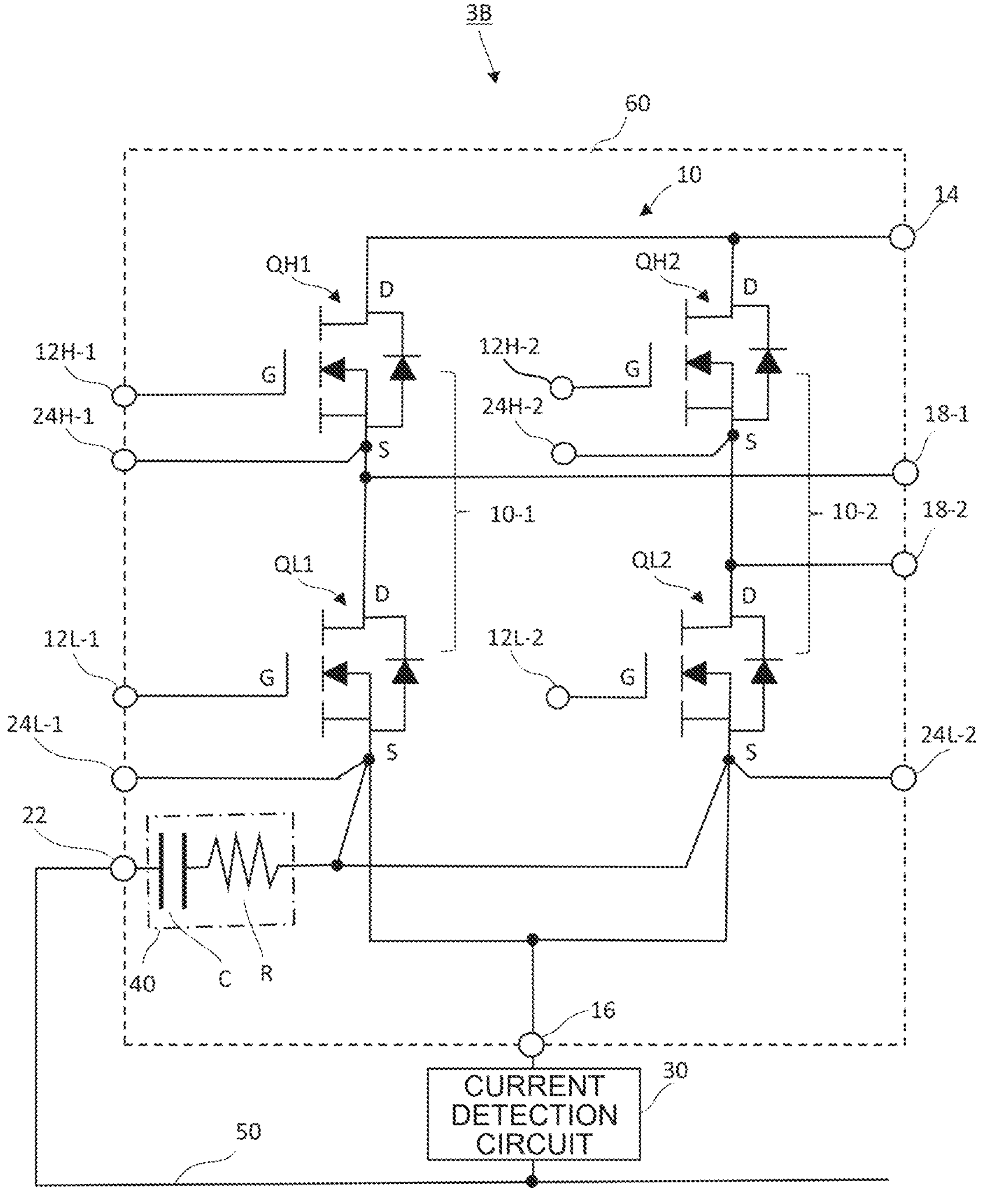
FIG. 11 is a view illustrating a semiconductor circuit 3B according to a modification 2 of the embodiment 3.
Figure 12:
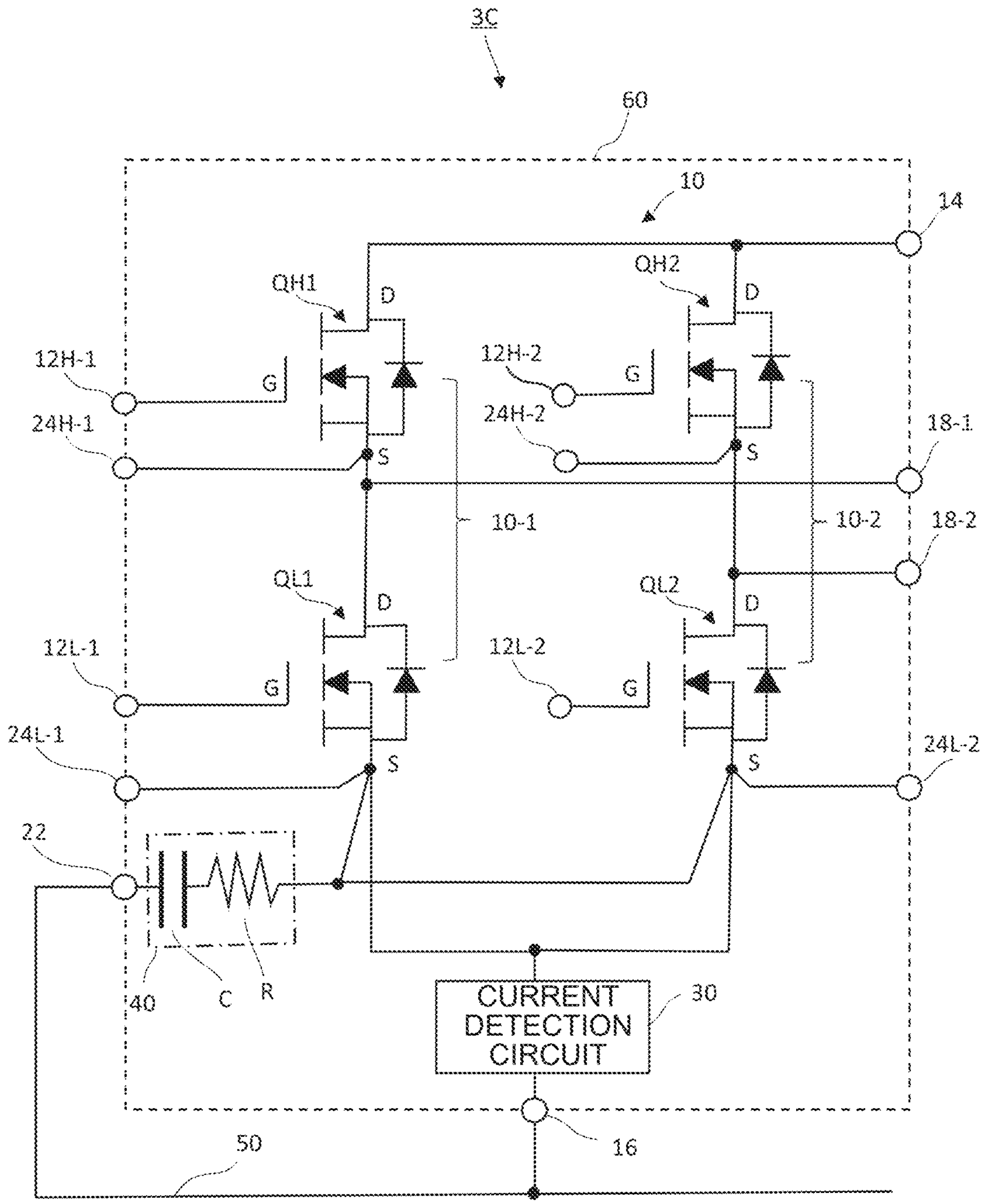
FIG. 12 is a view illustrating a semiconductor circuit 3C according to a modification 3 of the embodiment 3.
Figure 13:
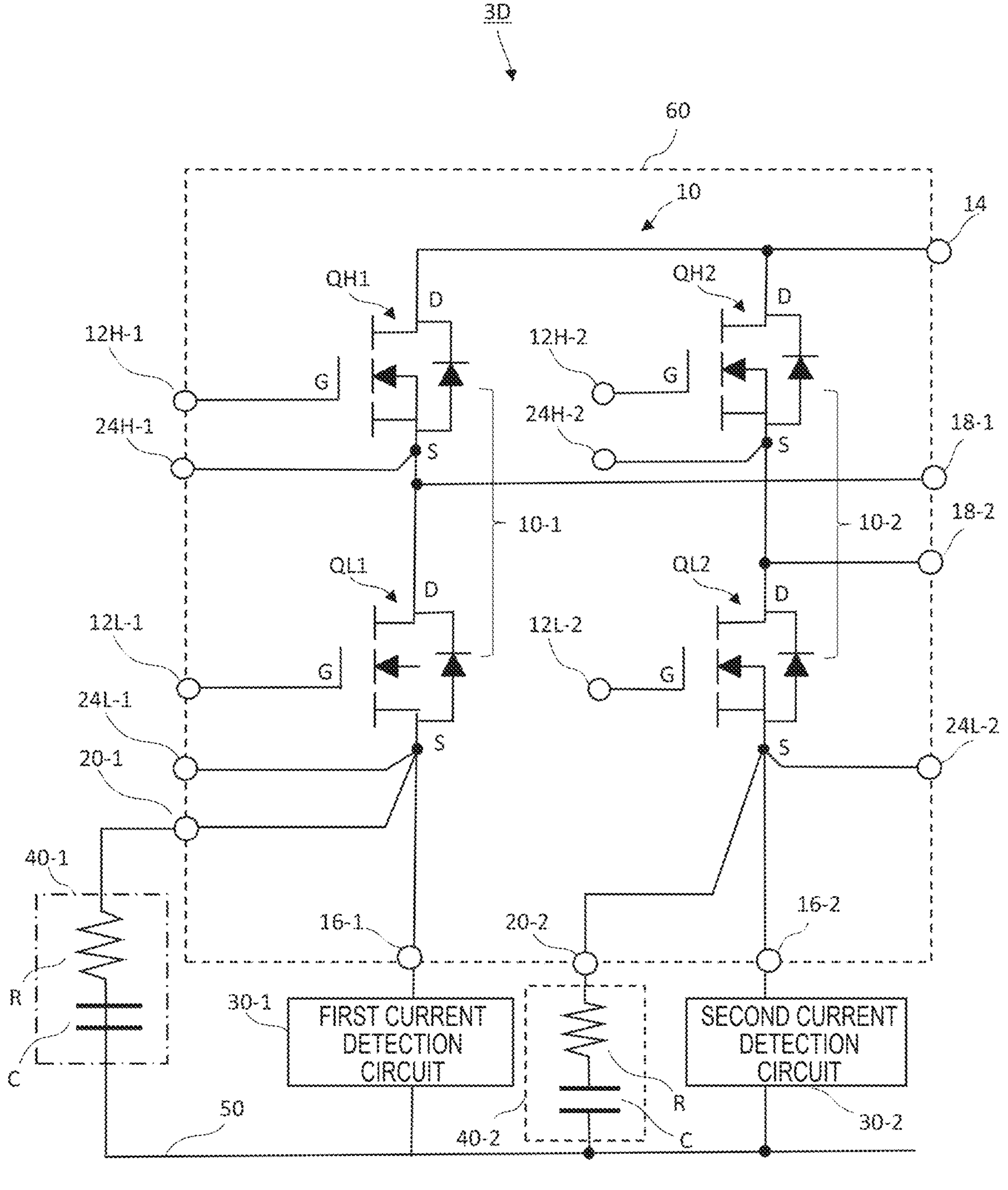
FIG. 13 is a view illustrating a semiconductor circuit 3D according to a modification 4 of the embodiment 3.
Figure 14:
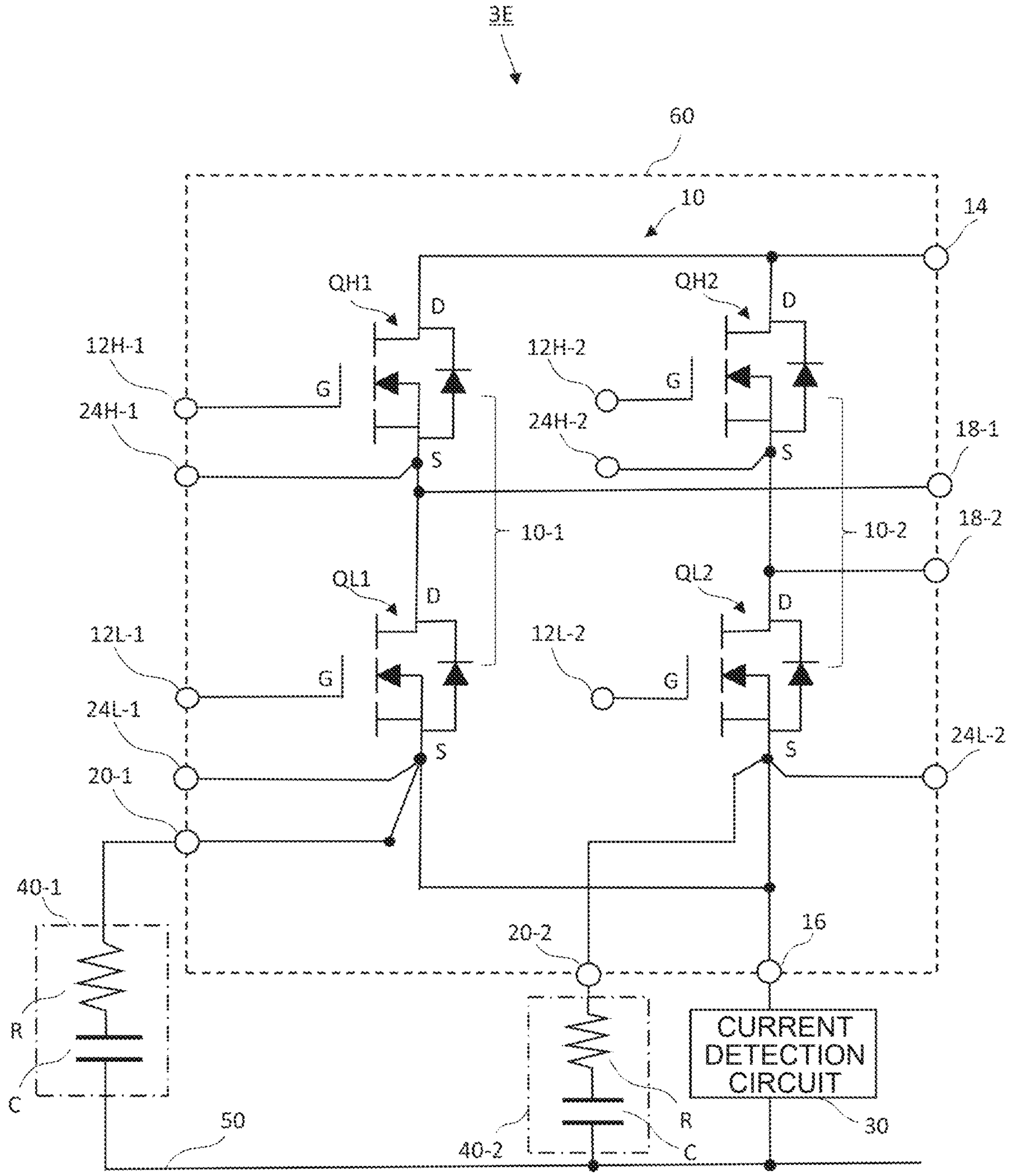
FIG. 14 is a view illustrating a semiconductor circuit 3E according to a modification 5 of the embodiment 3.
Figure 15:
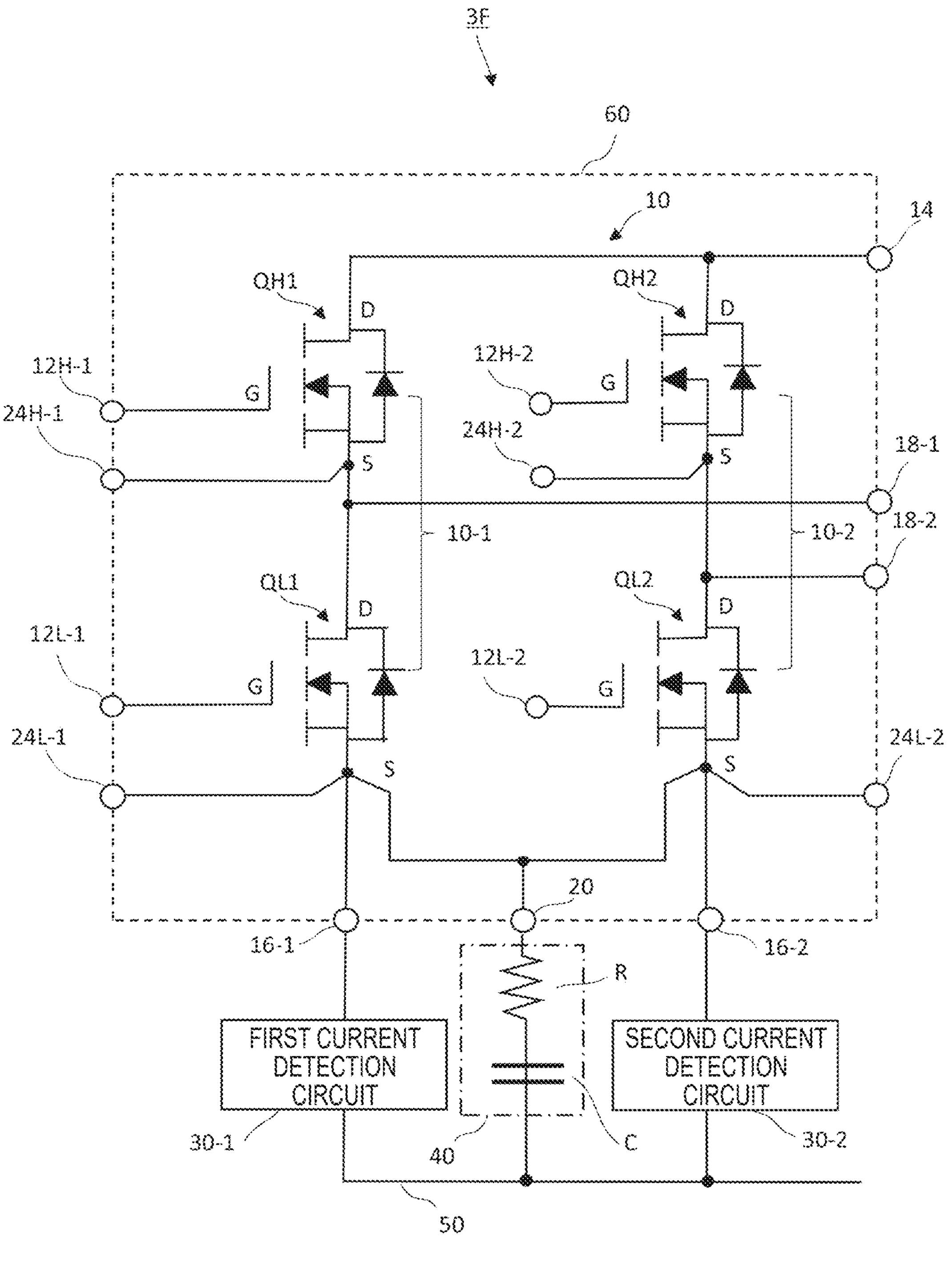
FIG. 15 is a view illustrating a semiconductor circuit 3F according to a modification 6 of the embodiment 3.

FIG. 10 is a view illustrating a semiconductor circuit 3A according to a modification 1 of the embodiment 3. FIG. 11 is a view illustrating a semiconductor circuit 3B according to a modification 2 of the embodiment 3. FIG. 12 is a view illustrating a semiconductor circuit 3C according to a modification 3 of the embodiment 3. FIG. 13 is a view illustrating a semiconductor circuit 3D according to a modification 4 of the embodiment 3. FIG. 14 is a view illustrating a semiconductor circuit 3E according to a modification 5 of the embodiment 3. FIG. 15 is a view illustrating a semiconductor circuit 3F according to a modification 6 of the embodiment 3.

[Modification 1 of Embodiment 3]

The semiconductor circuit 3A according to the modification 1 of the embodiment 3 has basically substantially the same configuration as the semiconductor circuit 3 according to the embodiment 3. However, the semiconductor circuit 3A according to the modification 1 of the embodiment 3 differs from the semiconductor circuit 3 according to the embodiment 3 with respect to the arrangement position of a noise eliminating circuit 40. That is, as illustrated in FIG. 10, the semiconductor circuit 3A according to the modification 1 of the embodiment 3 has the structure where a switching circuit 10 and, either one of a resistor R and a capacitor C that constitute an RC series circuit of the noise eliminating circuit 40 (in this case, the resistor R) are accommodated in a package 60, and a current detection circuit 30, and, the other out of the resistor R and the capacitor C that constitute the RC series circuit of the noise eliminating circuit 40 (in this case, the capacitor C) are disposed outside the package 60. In the semiconductor circuit 3A according to the modification 1 of the embodiment 3, symbol 21 indicates a terminal that is positioned between the resistor R and the capacitor C of the noise eliminating circuit 40.

According to the semiconductor circuit 3A of the modification 1 of the embodiment 3, as described above, either one of the resistor R and the capacitor C that constitute the RC series circuit of the noise eliminating circuit 40 is accommodated in the package 60. Accordingly, the number of parts mounted outside the package 60 can be reduced and hence, wiring of the noise eliminating circuit 40 is shortened so that impedance is lowered whereby the optimization can be easily performed by adjusting a characteristic of the noise eliminating circuit 40 whereby it is possible to more effectively suppress ringing that occurs in the gate G of the switching element.

[Modification 2 of Embodiment 3]

As illustrated in FIG. 11, the semiconductor circuit 3B according to the modification 2 of the embodiment 3 has the structure where both of switching circuit 10 and a noise eliminating circuit 40 are accommodated in a package 60, a current detection circuit 30 is disposed outside the package 60. In the semiconductor circuit 3B according to the modification 2 of the embodiment 3, symbol 22 indicates a terminal that is positioned between the noise eliminating circuit 40 and a ground wiring 50.

According to the semiconductor circuit 3B of the modification 2 of the embodiment 3, as described above, by accommodating the noise eliminating circuit 40 in the package 60, out of parts that constitute the noise eliminating circuit 40, no part is mounted outside the package 60. Accordingly, the wiring of the noise eliminating circuit 40 is further shortened so that impedance is lowered whereby it is possible to more effectively suppress ringing that occurs in gates G of switching elements.

[Modification 3 of Embodiment 3]

As illustrated in FIG. 12, the semiconductor circuit 3C according to the modification 3 of the embodiment 3 has the structure where all of a switching circuit 10, a noise eliminating circuit 40 and a current detection circuit 30 are accommodated in one package 60. In the semiconductor circuit 3C according to the modification 3 of the embodiment 3, symbol 22 indicates a terminal that is positioned between the noise eliminating circuit 40 and a ground wiring 50.

According to the semiconductor circuit 3C of the modification 3 of the embodiment 3, a mounting area can be reduced and hence, it is also possible to acquire an advantageous effect that a more compact semiconductor circuit can be provided.

[Modification 4 of Embodiment 3]

The semiconductor circuit 3D according to the modification 4 of the embodiment 3 basically has substantially the same configuration as the semiconductor circuit 3 according to the embodiment 3. However, the semiconductor circuit 3D according to the modification 4 of the embodiment 3 differs from the semiconductor circuit 3 of the embodiment 3 with respect to the configuration of a current detection circuit and the configuration of a noise eliminating circuit. The is, as illustrated in FIG. 13, the semiconductor circuit 3D according to the modification 4 of the embodiment 3 includes, as the current detection circuit, two current detection circuits (first current detection circuit 30-1 and second current detection circuit 30-2) provided corresponding to respective half bridge circuits. Further, the semiconductor circuit 3D according to the modification 4 of the embodiment 3 includes, as the noise eliminating circuit, two noise eliminating circuits (first noise eliminating circuit 40-1 and second noise eliminating circuit 40-2) provided corresponding to the respective half bridge circuits.

In the semiconductor circuit 3D according to the modification 4 of the embodiment 3, a noise eliminating circuit terminal 20-1 and a source sense terminal 24L-1 on a low side may be shared in common thus forming one terminal, or a noise eliminating circuit terminal 20-2 and a source sense terminal 24L-2 on a low side may be shared in common thus forming one terminal.

In this manner, the semiconductor circuit 3D according to the modification 4 of the embodiment 3 differs from the case of the semiconductor circuit 3 according to the embodiment 3 with respect to the configuration of the current detection circuit and the configuration of the noise eliminating circuit. However, respective noise eliminating circuits 40-1, 40-2 are disposed between the respective low-side switching elements (transistors QL1, QL2) and a ground wiring 50. Accordingly, in the same manner as the case of the semiconductor circuit 3 according to the embodiment 3, it is possible to suppress ringing that occurs between a switching circuit 10 (in this case, between sources S of the transistors QL1, QL2 and ground wiring 50) and hence, it is possible to suppress ringing that occurs in gates G of switching elements.

[Modification 5 of Embodiment 5]

A semiconductor circuit 3E according to the modification 5 of the embodiment 3 basically has substantially the same configuration as the semiconductor circuit 3 according to the embodiment 3. However, the semiconductor circuit 3E according to the modification 5 of the embodiment 3 differs from the case of the semiconductor circuit 3 according to the embodiment 3 with respect to the configuration of a noise eliminating circuit. That is, as illustrated in FIG. 14, the semiconductor circuit 3E according to the modification 5 of the embodiment 3 includes, as the noise eliminating circuit, two noise eliminating circuits (first noise eliminating circuits 40-1, 40-2) provided corresponding to respective half bridge circuits. In the semiconductor circuit 3E according to the modification 5 of the embodiment 3, a noise eliminating circuit terminal 20-1 and a low-side source sense terminal 24L-1 may be shared in common thus forming one terminal, and a noise eliminating circuit terminal 20-2 and a low-side source sense terminal 24L-2 may be shared in common thus forming one terminal.

In this manner, the semiconductor circuit 3E according to the modification 5 of the embodiment 3 differs from the case of the semiconductor circuit 3 according to the embodiment 3 with respect to the configuration of the noise eliminating circuit. However, respective noise eliminating circuits 40-1, 40-2 are disposed between the respective low-side switching elements (transistors QL1, QL2) and a ground wiring 50. Accordingly, in the same manner as the case of the semiconductor circuit 3 according to the embodiment 3, it is possible to suppress ringing that occurs between a switching circuit 10 (in this case, between the sources S of the transistors QL1, QL2 and the ground wiring 50) and hence, it is possible to suppress ringing that occurs in gates G of switching elements.

[Modification 6 of Embodiment 3]

The semiconductor circuit 3F according to the modification 6 of the embodiment 3 basically has substantially the same configuration as the semiconductor circuit 3 according to the embodiment 3. However, the semiconductor circuit 3F according to the modification 6 of the embodiment 3 differs from the case of the semiconductor circuit 3 according to the embodiment 3 with respect to the configuration of a current detection circuit. That is, as illustrated in FIG. 15, the semiconductor circuit 3F according to the modification 6 of the embodiment 3 includes, as the current detection circuit, two current detection circuits (first current detection circuit 30-1 and second current detection circuit 30-2) provided corresponding to respective half bridge circuits.

In this manner, the semiconductor circuit 3F according to the modification 6 of the embodiment 3 differs from the case of the semiconductor circuit 3 according to the embodiment 3 with respect to the current detection circuit. However, a noise eliminating circuit 40 is connected to the current detection circuits 30-1, 30-2 in a parallel relationship between the respective low-side switching elements (transistors QL1, QL2) and a ground wiring 50. Accordingly, in the same manner as the semiconductor circuit 3 according to the embodiment 3, it is possible to suppress ringing that occurs in a switching circuit 10 (in this case, between the sources S of the transistors QL1, QL2 and the ground wiring 50) and hence, it possible to suppress ringing that occurs in gates of the switching elements.

Embodiment 4

Figure 16:
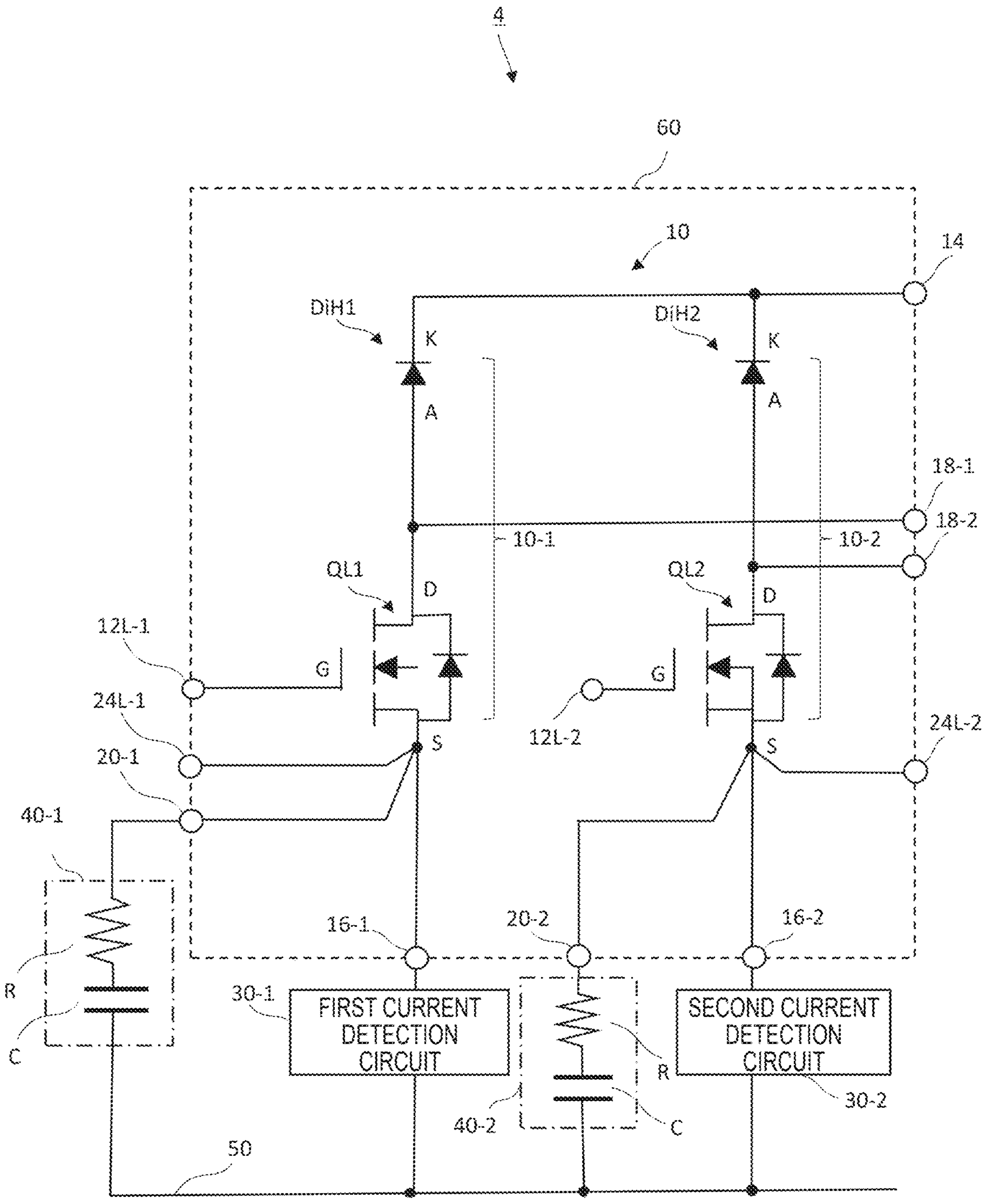
FIG. 16 is a view illustrating a semiconductor circuit 4 according to an embodiment 4.

FIG. 16 is a view illustrating a semiconductor circuit 4 according to an embodiment 4. The semiconductor circuit 4 according to the embodiment 4 basically has substantially the same configuration as the semiconductor circuit 3D according to the modification 4 of the embodiment 3. However, the semiconductor circuit 4 according to the embodiment 4 differs from the configuration of the semiconductor circuit 3D according to the modification 4 of the embodiment 3 with respect to the configuration of high-side switching elements. That is, as illustrated in FIG. 16, the semiconductor circuit 4 according to the embodiment 4 uses two diodes (diodes DiH1, DiH2) in place of two transistors (transistors QH1, QH2) on a high-side side.

In this manner, the semiconductor circuit 4 according to the embodiment 4 differs from the case of the semiconductor circuit 3D according to the modification 4 of the embodiment 3 with respect to the configuration of the high-side switching element. However, between respective low-side switching elements (transistor QL1, QL2) and a ground wiring 50, a noise eliminating circuit 40-1 is connected in a parallel relationship with a current detection circuit 30-1, and a noise eliminating circuit 40-2 is connected in a parallel relationship with a current detection circuit 30-2. Accordingly, in the same manner as the case of the semiconductor circuit 3D according to the modification 4 of the embodiment 3, it is possible to suppress ringing that occurs in a switching circuit 10 (in this case, between the sources S of the transistors QL1, QL2 and the ground wiring 50) and hence, it is possible to suppress ringing that occurs in gates G of the switching elements.

Embodiment 5

Figure 17:
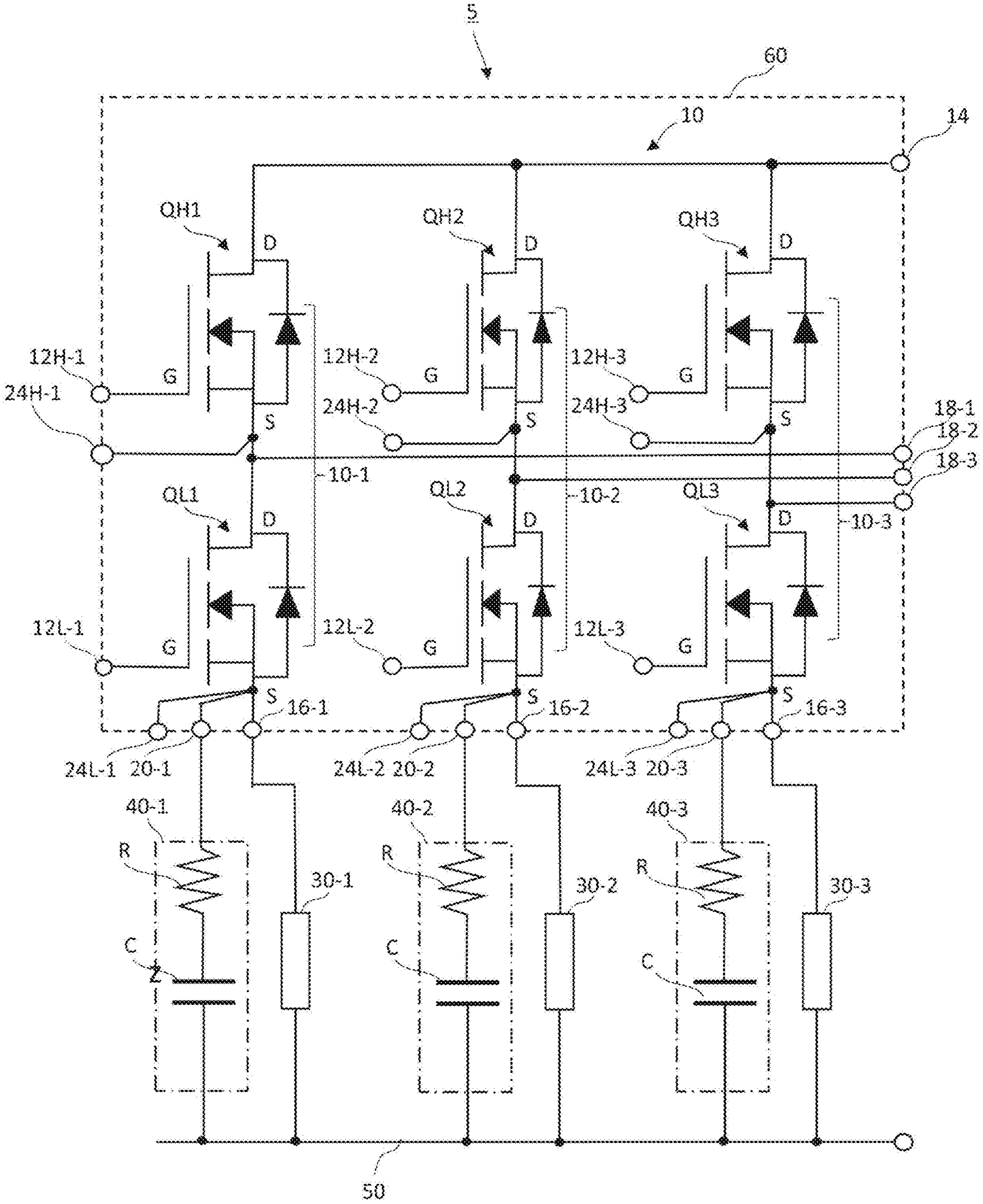
FIG. 17 is a view illustrating a semiconductor circuit 5 according to an embodiment 5.

FIG. 17 is a view illustrating a semiconductor circuit 5 according to the embodiment 5. The semiconductor circuit 5 according to the embodiment 5 basically has substantially the same configuration as the semiconductor circuit 3 according to the embodiment 3. However, the semiconductor circuit 5 according to the embodiment 5 differs from the semiconductor circuit 3 according to the embodiment 3 with respect to the configuration of a semiconductor circuit 10. That is, as illustrated in FIG. 17, the semiconductor circuit 5 according to the embodiment 5 uses an inverter circuit where three half bridge circuits are connected in parallel to each other as the semiconductor circuit 10.

In this manner, the semiconductor circuit 5 according to the embodiment 5 differs from the case of the semiconductor circuit 3 according to the embodiment 3 with respect to the configuration of the switching circuit 10. However, between respective low-side switching elements (transistors QL1, QL2, QL3) and a ground wiring 50, a noise eliminating circuit (first noise eliminating circuit 40-1) is connected in a parallel relationship with respect to a current detection circuit (first current detection circuit 30-1), a noise eliminating circuit (second noise eliminating circuit 40-2) is connected in a parallel relationship with respect to a current detection circuit (second current detection circuit 30-2), and a noise eliminating circuit (third noise eliminating circuit 40-3) is connected in a parallel relationship with a current detection circuit (third current detection circuit 30-3). Accordingly, in the same manner as the case of the semiconductor circuit 3 according to the embodiment 3, it is possible to suppress ringing that occurs in the switching circuit 10 (in this case, between the sources S of the transistors QL1, QL2, QL3 and the ground wiring 50) and hence, it is possible to suppress ringing that occurs in gates G of the switching elements.

[Planar Layout of Modification 5 of Embodiment 3]

Figure 18:
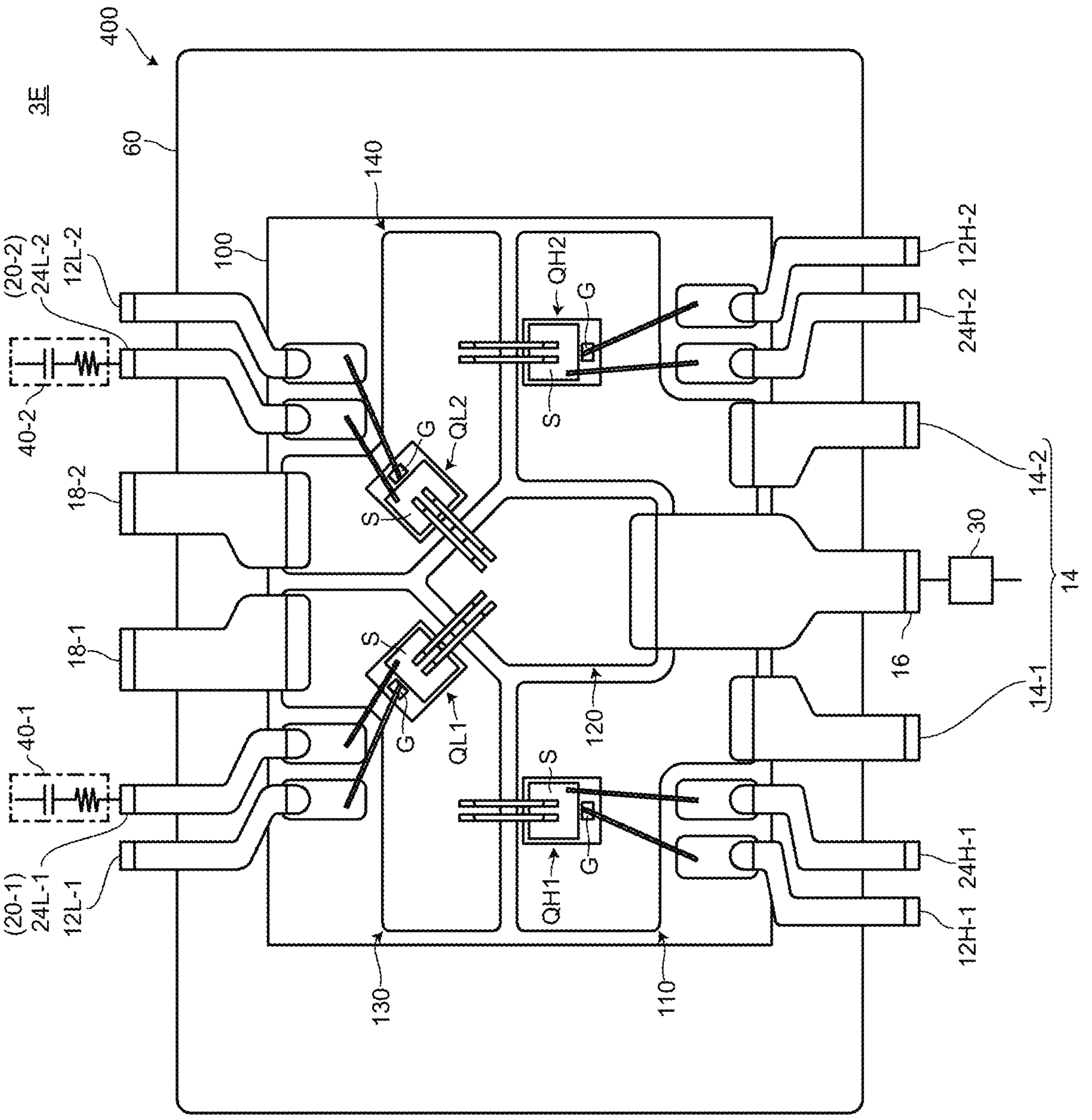
FIG. 18 is a planar layout view illustrating the semiconductor circuit 3E according g to the modification 5 of the embodiment 3.

FIG. 18 is a planar layout view illustrating the semiconductor circuit 3E according to the modification 5 of the embodiment 3 (see FIG. 14, in the drawing, a ground wiring not being illustrated). In FIG. 18 and FIG. 19 to FIG. 21 illustrated later, symbol 100 indicates an insulation board, symbols 110, 120, 130, 140 indicate wiring patterns, and symbols 400, 400A, 400B, 400C indicate circuit patterns.

In the semiconductor circuit 3E according to the modification 5 of the embodiment 3, the first noise eliminating circuit 40-1 is connected with the noise eliminating circuit terminal 20-1 shared in common with the source sense terminal 24L-1 of the transistor QL1, and the second noise eliminating circuit 40-2 is connected with the noise eliminating circuit terminal 20-2 shared in common with the source sense terminal 24L-2 of the transistor QL2. Further, the current detection circuit 30 is connected with the ground terminal 16.

The semiconductor circuit 3E according to the modification 5 of the embodiment 3 has the planar layout illustrated in FIG. 18. On the other hand, between respective low-side switching elements (transistors QL1, QL2) and a ground wiring 50 not illustrated in the drawings, the noise eliminating circuits 40-1, 40-2 are connected in parallel relationship with respect to the current detection circuit 30 (see FIG. 14). Accordingly, in the same manner as the case of the semiconductor circuit 3 according to the embodiment 3, it is possible to suppress ringing that occurs in the switching circuit 10 (in this case, between sources S of transistors QL1, QL2 and ground wiring 50) and hence, it is possible suppress ringing that occurs in gates G of the switching elements.

[Modification 7 of Embodiment 3]

Figure 19:
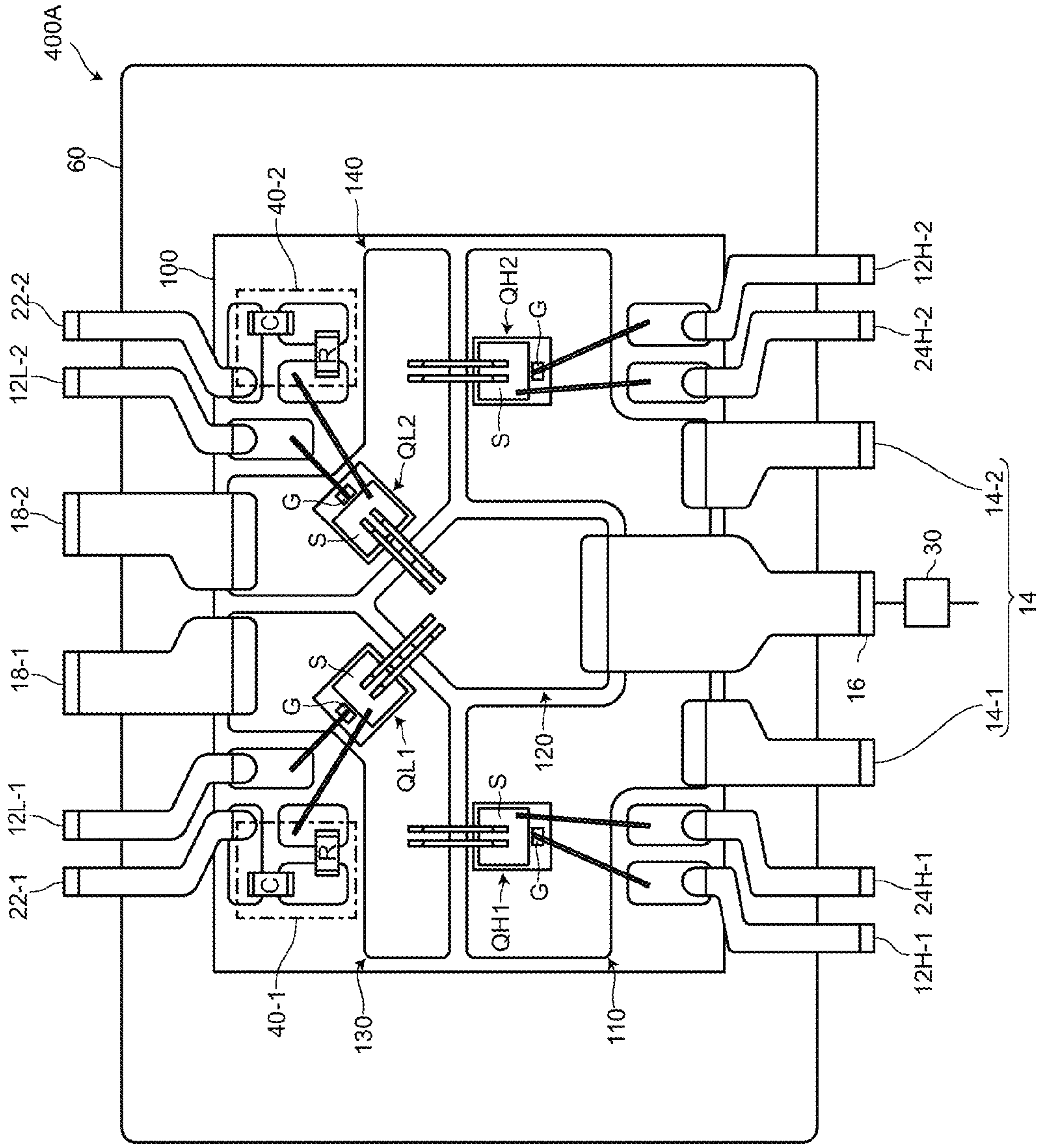
FIG. 19 is a planar layout view illustrating a semiconductor circuit 3G according to a modification 7 of the embodiment 3.

FIG. 19 is a planar layout view illustrating a semiconductor circuit 3G according to the modification 7 of the embodiment 3.

The semiconductor circuit 3G according to the modification 7 of the embodiment 3 basically has substantially the same configuration as the semiconductor circuit 3E according to the modification 5 of the embodiment 3. However, the semiconductor circuit 3G according to the modification 7 of the embodiment 3 differs from the semiconductor circuit 3E according to the modification 5 of the embodiment 3 with respect to the arrangement positions of noise eliminating circuits. That is, as illustrated in FIG. 19, in the semiconductor circuit 3G according to the modification 7 of the embodiment 3, noise eliminating circuits 40-1, 40-2 are disposed in a package 60.

In this manner, in the semiconductor circuit 3G according to the modification 7 of the embodiment 3, the noise eliminating circuits 40-1, 40-2 are accommodated in the package 60. On the other hand, between respective low-side switching elements (transistors QL1, QL2) and a ground wiring 50 not illustrated in the drawing, the noise eliminating circuits 40-1, 40-2 are connected in a parallel relationship with respect to a current detection circuit 30. Accordingly, in the same manner as the case of the semiconductor circuit 3E according to the modification 5 of the embodiment 3, it is possible to suppress ringing that occurs in the switching circuit 10 (in this case, between the sources S of the transistors QL1, QL2 and the ground wiring 50) and hence, it is possible to suppress ringing that occurs in gates G of switching elements.

Further, in the semiconductor circuit 3G according to the modification 7 of the embodiment 3, the noise eliminating circuits 40-1, 40-2 are accommodated in the package 60. Accordingly, the wirings of the noise eliminating circuits 40-1, 40-2 are further shortened so that impedance is lowered whereby it is possible to more effectively suppress ringing that occurs in the gates of the switching elements.

[Modification 8 of Embodiment 3]

Figure 20:
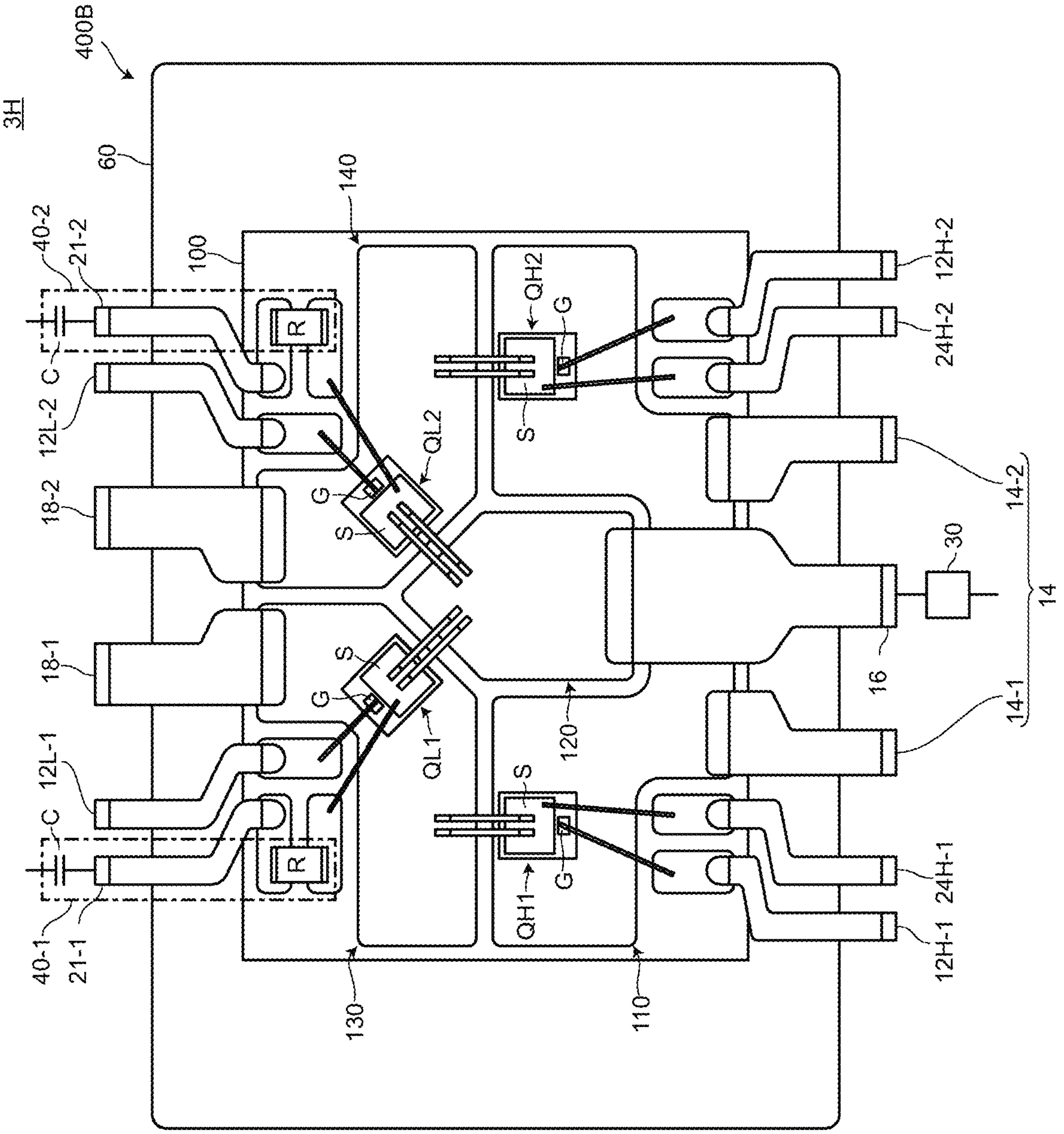
FIG. 20 is a planar layout view illustrating a semiconductor circuit 3H according to a modification 8 of the embodiment 3.

FIG. 20 is a planar layout view illustrating a semiconductor circuit 3H according to a modification 8 of the embodiment 3. In the semiconductor circuit 3H according to the modification 8 of the embodiment 3, the entirety of noise eliminating circuits 40-1, 40-2 are disposed in a package 60. However, the present invention is not limited to such a configuration. As illustrated in FIG. 20, only portions (in this case, only resistors R) of the noise eliminating circuits 40-1, 40-2 can be accommodated in the package 60.

TEST EXAMPLE

Following test examples were performed to confirm the advantageous effects of the present invention.

1. Semiconductor Circuits Used in Test Examples

Figure 21:
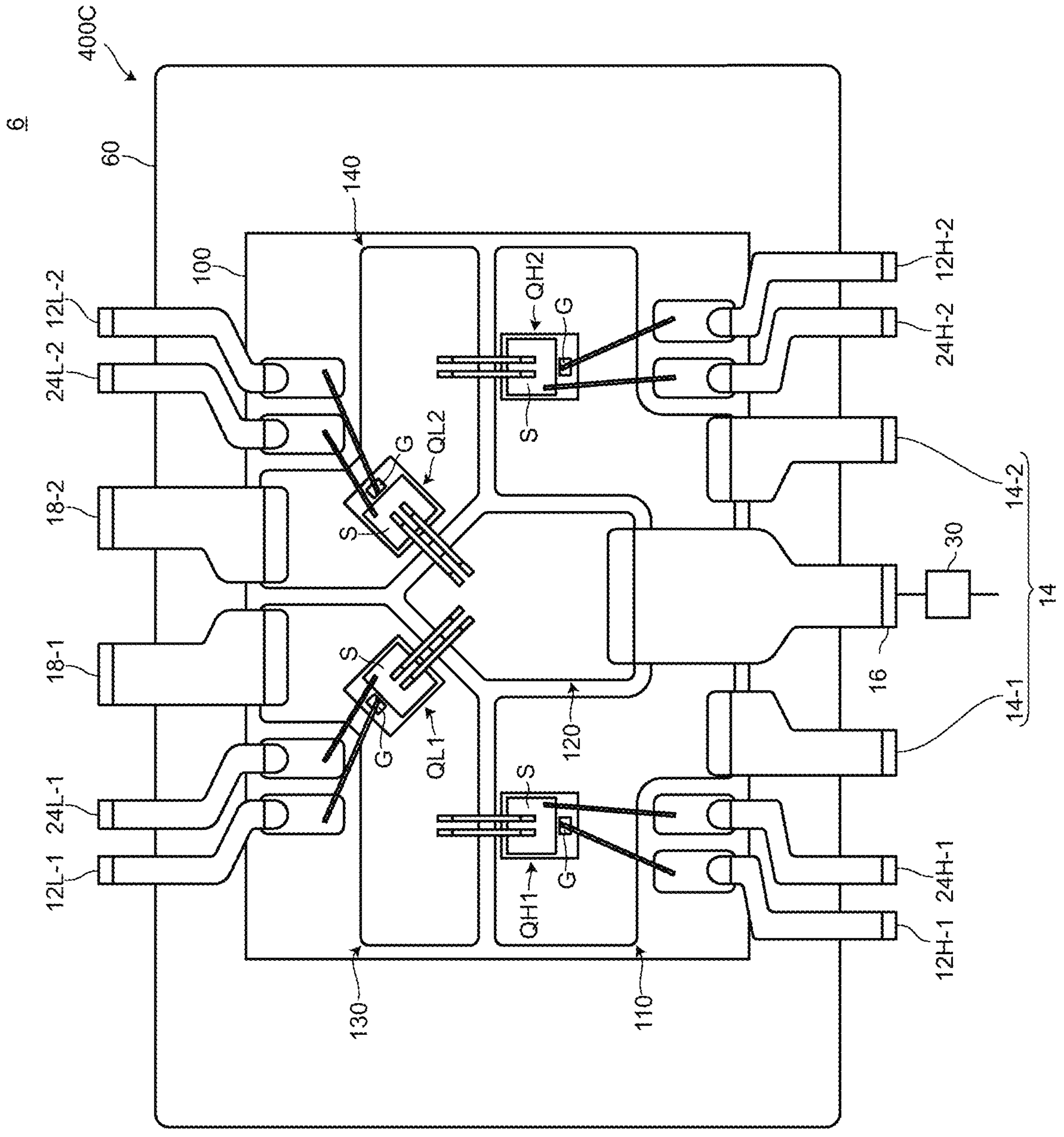
FIG. 21 is a planar layout view illustrating a semiconductor circuit 6 according to a test example 2 (comparison example).

In the test example, the semiconductor circuit 3E according to the modification 5 of the embodiment 3 is used as a test example 1 (embodiment example) (see FIG. 14 and FIG. 18). On the other hand, an example from which the noise eliminating circuits 40-1, 40-2 are eliminated from the test example 1 (embodiment example) was used as an example 2 (comparison example) (see FIG. 21). FIG. 21 is a planar layout view illustrating the semiconductor circuit 6 relating to the test example 2 (comparison example).

2. Testing Method of Test Examples

The test was performed with respect to the test example 1 (embodiment example) and the test example 2 (comparison example) respectively on the following condition. The test was performed in such a manner that, a drain-source voltage Vds, a gate-source voltage Vgs and a drain-source current Id were simulated by a circuit simulator in a state where a direct current voltage of 400 V was applied between the ground wiring 50 (not illustrated in the drawing) and the power terminals 14-1, 14-2, and gate voltages for enabling a full bridge operation were applied to gate terminals 12H-1, 12H-2, 12L-1, 12L-2 of four transistors QH1, QH2, QL1, QL2 at suitable timing.

3. Test Results in Test Examples

Figure 22:
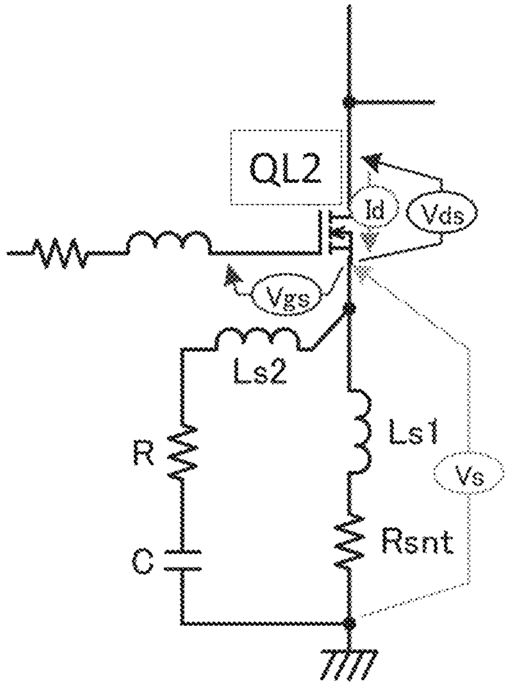
FIG. 22 is a view illustrating a simulation model in the test example.
Figure 23A:
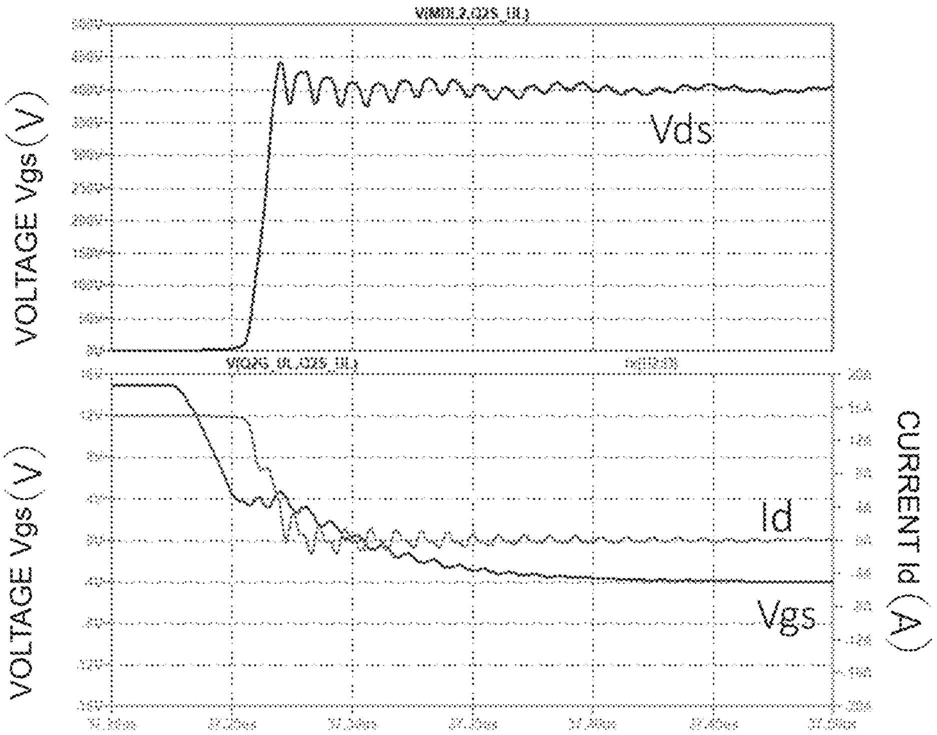
FIG. 23A and FIG. 23B are views illustrating a result of simulation in the test example.
Figure 23B:
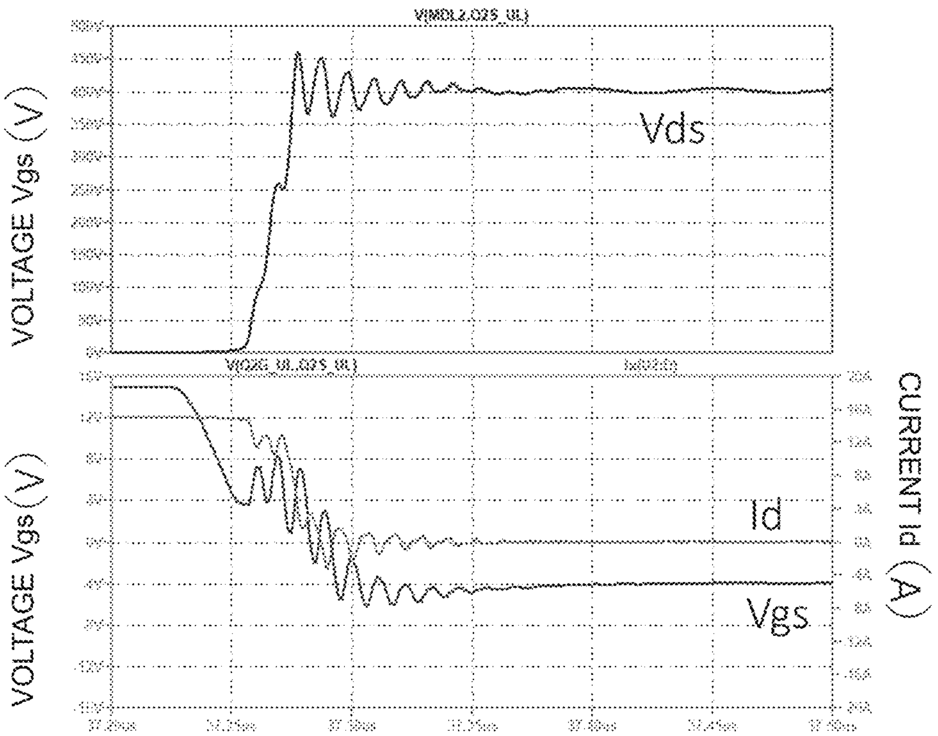

FIG. 22 is a view illustrating a simulation model in the test example. In the drawing, symbol Ls1 indicates inductance of a wiring of a current detection circuit, symbol Rsnt indicates a current detection resistance of the current detection circuit, symbol Ls2 indicates a wiring of a noise eliminating circuit, symbol Vgs indicates a gate-source voltage of the transistor QL2, symbol Vds indicates a drain-source voltage of the transistor QL2, symbol Vs indicates a source voltage of the transistor QL2, and symbol Id indicates a drain current of the transistor QL2. FIG. 23A and FIG. 23B are views illustrating a simulation result in the test examples. FIG. 23A is a view illustrating a simulation result in the test example 1 (embodiment example), and FIG. 23B is a view illustrating a simulation result in the test example 2 (comparison example).

In the test example 2 (comparison example), as can be understood from FIG. 23B, frequency of noise is approximately 125 MHz, and its harmonic components are superimposed on a switching waveform. The RC series circuit provided for eliminating noise forms a so-called first-order low pass filter and hence, cut-off frequency fc can be expressed by a following formula.

$$fc = 1/(2\pi Rc) \quad (1)$$

Accordingly, if cut-off frequency is decided to be equal to or below the frequency of noise, a resistance value R1 can be decided, and capacitance C1 of a capacitor can be decided by the following formula.

$$C = 1/(2\pi Tfc) \quad (2)$$

As can be understood from FIG. 23B, frequency of noise is approximately 125 MHZ. Accordingly, for example, assuming cut-off frequency as 100 MHz and the resistance value R1 as 1 ohm, capacitance C1 of the capacitor becomes 1.59·nF from the above-mentioned formula (2). Assuming the resistance value R1 as 2 ohm, capacitance C1 of the capacitor becomes 0.79 nF from the above-mentioned formula (2). Assuming cut-off frequency as 50 MHZ and the resistance value R1 as 1 ohm, capacitance C1 of the capacitor becomes 3.18 nF from the above-mentioned formula (2). Assuming the resistance value R1 is 2 ohm, capacitance C1 of the capacitor becomes 1.59 nF from the above-mentioned formula (2).

With respect to the frequency of noise, it is necessary that the cutoff frequency is equal to or below the frequency of noise. Further, it is necessary that that the cutoff frequency is equal to or more than switching frequency of the bridge circuit. To ease the gradient of the rising and the falling of a switching waveform as the cutoff frequency approaches closer to switching frequency, it is desirable that the cutoff frequency is higher than the switching frequency. The cutoff frequency is set to a value between the noise frequency and the switching frequency. It is necessary to decide the cutoff frequency by taking into account these conditions.

FIG. 23A illustrates a simulation result when the cutoff frequency is set to 100 MHZ. A graph on an upper side of FIG. 23A indicates a drain-source voltage Vds, and a graph on a lower side of FIG. 23A indicates a gate-source voltage Vgs and a drain-source current Id. FIG. 23A illustrates the simulation result obtained by deciding (optimizing) the resistance value R1 and the capacitance C1 of the capacitor by setting cut-off frequency to 100 MHz with respect to values in FIG. 23B.

As can be understood by comparing FIG. 23A and FIG. 23B, in the case where noise eliminating circuit is connected between the switching circuit and the ground wiring in a parallel relationship with respect to the current detection circuit as in the test example 1 (embodiment example), ringing that occurs in the switching circuit can be suppressed more compared to the case of the test example 2 (comparison example). Accordingly, it is found that the test example 1 (embodiment example) can suppress ringing that occurs in the gate of the switching element.

The present invention is not limited to the above-mentioned respective embodiments, and various modifications can be carried out without departing from the gist of the present invention. For example, the following modifications are conceivable.

(1) The shapes, the numbers, the sizes, the positions and the like of the configurational elements in the semiconductor element of the present invention are not limited to the values illustrated in the respective drawings, and can be suitably changed provided that the technical features of the present invention are not impaired.

(2) In the respective modifications, the MOSFET is used as the transistor. However, the present invention is not limited to such a configuration. An IGBT can be used as the transistor.

(3) In the modification 1 of each of the embodiments 1 to 3, out of the resistor R and the capacitor C that constitute the RC series circuit of the noise eliminating circuit 40, the resistor R is accommodated in the package 60, and the capacitor C is disposed outside the package 60. However, the present invention is not limited to such a configuration. Out of the resistor R and the capacitor C that constitute the RC series circuit of the noise eliminating circuit 40, the capacitor C may be accommodated in the package 60, and the resistor R may be disposed outside the package 60.

The invention claimed is:

1. A semiconductor circuit comprising:

a switching circuit having at least one switching element;

a ground wiring; and a current detection circuit connected between the switching circuit and the ground wiring, wherein a noise eliminating circuit is connected between the switching circuit and the ground wiring in a parallel relationship with respect to the current detection circuit, and the noise eliminating circuit is an RC series circuit where a resistor and a capacitor are connected in series.

2. The semiconductor circuit according to claim 1, wherein the switching circuit is a circuit that includes a half bridge circuit having a high-side switching element and a low-side switching element, and the noise eliminating circuit is connected between the low-side switching element and the ground wiring.

3. The semiconductor circuit according to claim 2, wherein the switching circuit is a full bridge circuit where two half bridge circuits are connected in parallel to each other.

4. The semiconductor circuit according to claim 2, wherein both of the high-side switching element and the low-side switching element are each formed of a transistor.

5. The semiconductor circuit according to claim 2, wherein the high-side switching element is formed of a diode, and the low-side switching element is formed of a transistor.

6. The semiconductor circuit according to claim 2, wherein the switching circuit is a circuit where three or more half bridge circuits are connected in parallel to each other.

7. The semiconductor circuit according to claim 1, wherein the semiconductor circuit has a structure where the switching circuit and either one of the resistor and the capacitor that constitute the RC series circuit are accommodated inside a package, and the current detection circuit and an other out of the resistor and the capacitor that constitute the RC series circuit are disposed outside the package.

8. The semiconductor circuit according to claim 1, wherein the semiconductor circuit has a structure where all of the switching circuit, the noise eliminating circuit and the current detection circuit are accommodated in one package.

9. A semiconductor circuit comprising:

a switching circuit having at least one switching element;

a ground wiring; and a current detection circuit connected between the switching circuit and the ground wiring, wherein a noise eliminating circuit is connected between the switching circuit and the ground wiring in a parallel relationship with respect to the current detection circuit, the switching circuit is accommodated in a package, and both of the current detection circuit and the noise eliminating circuit are disposed outside the package.

10. A semiconductor circuit comprising:

a switching circuit having at least one switching element;

a ground wiring; and a current detection circuit connected between the switching circuit and the ground wiring, wherein a noise eliminating circuit is connected between the switching circuit and the ground wiring in a parallel relationship with respect to the current detection circuit, the semiconductor circuit has a structure where both the switching circuit and the noise eliminating circuit are accommodated in a package, and the current detection circuit is disposed outside the package.

* * * * *